(12) United States Patent
Chou

(10) Patent No.: US 12,295,138 B2
(45) Date of Patent: May 6, 2025

(54) SEMICONDUCTOR DEVICE WITH SUPPORTING LAYER AND METHOD FOR FABRICATING THE SAME

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 88 days.

(21) Appl. No.: 18/369,302

(22) Filed: Sep. 18, 2023

(65) Prior Publication Data

US 2024/0090201 A1    Mar. 14, 2024

Related U.S. Application Data

(62) Division of application No. 17/940,968, filed on Sep. 8, 2022.

(51) Int. Cl.
*H10B 12/00*    (2023.01)

(52) U.S. Cl.
CPC ....... *H10B 12/315* (2023.02); *H10B 12/0335* (2023.02); *H10B 12/34* (2023.02)

(58) Field of Classification Search
CPC .. H10B 12/315; H10B 12/0335; H10B 12/34; H10B 12/033; H10B 12/50; H10B 12/05; H10B 12/482; H10B 12/488; H10D 1/716; H10D 1/714

See application file for complete search history.

(56) References Cited

U.S. PATENT DOCUMENTS

2011/0159660 A1*  6/2011  Kang ............... H10D 1/716
                                                  216/17
2021/0091087 A1*  3/2021  Liao ............... H10B 12/053

FOREIGN PATENT DOCUMENTS

CN    102117698 A    7/2011
CN    108336068 A    7/2018
CN    111834338 A    10/2020

OTHER PUBLICATIONS

Office Action and and the search report mailed on Nov. 9, 2023 related to Taiwanese Application No. 112110387.

* cited by examiner

*Primary Examiner* — Shih Tsun A Chou
*Assistant Examiner* — Jonathan Keith Little
(74) *Attorney, Agent, or Firm* — Xuan Zhang

(57) ABSTRACT

A semiconductor device includes a plurality of drain regions in a substrate; a plurality of capacitor plugs on the plurality of drain regions; a plurality of lower electrodes on the plurality of capacitor plugs and respectively including a U-shaped cross-sectional profile; a lower supporting layer above the substrate, against on outer surfaces of the plurality of lower electrodes, and including: a plurality of first openings along the lower supporting layer and between the plurality of lower electrodes; and a higher supporting layer above the lower supporting layer, against on the outer surfaces of the plurality of lower electrodes, and including: a plurality of second openings along the higher supporting layer and topographically aligned with the plurality of first openings. The widths of the plurality of first openings and the widths of the plurality of second openings are substantially the same.

10 Claims, 33 Drawing Sheets

SEMICONDUCTOR DEVICE WITH SUPPORTING LAYER AND METHOD FOR FABRICATING THE SAME

CROSS-REFERENCE TO RELATED APPLICATION

This application is a divisional application of U.S. Non-Provisional application Ser. No. 17/940,968 filed Sep. 8, 2022, which is incorporated herein by reference in its entirety.

TECHNICAL FIELD

The present disclosure relates to a semiconductor device and a method for fabricating the semiconductor device, and more particularly, to a semiconductor device with a supporting layer and a method for fabricating the semiconductor device with the supporting layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a plurality of drain regions positioned in a substrate; a plurality of capacitor plugs positioned on the plurality of drain regions; a plurality of lower electrodes positioned on the plurality of capacitor plugs and respectively including a U-shaped cross-sectional profile; a lower supporting layer positioned above the substrate, positioned against on outer surfaces of the plurality of lower electrodes, and including: a plurality of first openings positioned along the lower supporting layer and between the plurality of lower electrodes; and a higher supporting layer positioned above the lower supporting layer, positioned against on the outer surfaces of the plurality of lower electrodes, and including: a plurality of second openings positioned along the higher supporting layer and topographically aligned with the plurality of first openings. The widths of the plurality of first openings and the widths of the plurality of second openings are substantially the same.

Another aspect of the present disclosure provides a semiconductor device including a plurality of drain regions positioned in a substrate; a plurality of capacitor plugs positioned on the plurality of drain regions; a plurality of lower electrodes positioned on the plurality of capacitor plugs and respectively including a U-shaped cross-sectional profile; a lower supporting layer positioned above the substrate, positioned against on outer surfaces of the plurality of lower electrodes, and including: a plurality of first openings positioned along the lower supporting layer and between the plurality of lower electrodes; and a higher supporting layer positioned above the lower supporting layer, positioned against on the outer surfaces of the plurality of lower electrodes, and including: a plurality of second openings positioned along the higher supporting layer and topographically aligned with the plurality of first openings. The widths of the plurality of first openings and the widths of the plurality of second openings are substantially the same. Top surfaces of the plurality of lower electrodes and a top surface of the higher supporting layer are substantially coplanar.

Another aspect of the present disclosure provides a method for fabricating a semiconductor device including providing a substrate, forming plurality of drain regions in the substrate, and forming a plurality of capacitor plugs on the plurality of drain regions; forming a bottom sacrificial layer on the plurality of capacitor plugs, forming a lower supporting layer on the bottom sacrificial layer, and forming a plurality of first openings along the lower supporting layer to expose the bottom sacrificial layer; forming a top sacrificial layer on the lower supporting layer and forming a higher supporting layer on the top sacrificial layer, forming a plurality of capacitor openings to expose the plurality of capacitor plugs, conformally forming a plurality of lower electrodes in the plurality of capacitor openings, and forming a plurality of second openings along the higher supporting layer and topographically aligned with the plurality of first openings; removing the top sacrificial layer and the bottom sacrificial layer to expose outer surfaces of the plurality of lower electrodes and conformally forming a capacitor dielectric layer on the plurality of lower electrodes, the lower supporting layer, and the higher supporting layer, and conformally forming an upper electrode on the capacitor dielectric layer. The widths of the plurality of first openings and the widths of the plurality of second openings are substantially the same.

Due to the design of the semiconductor device of the present disclosure, the plurality of first openings and the plurality of second openings may be formed using the same photomask. As a result, the cost of fabricating the semiconductor devices may be reduced.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
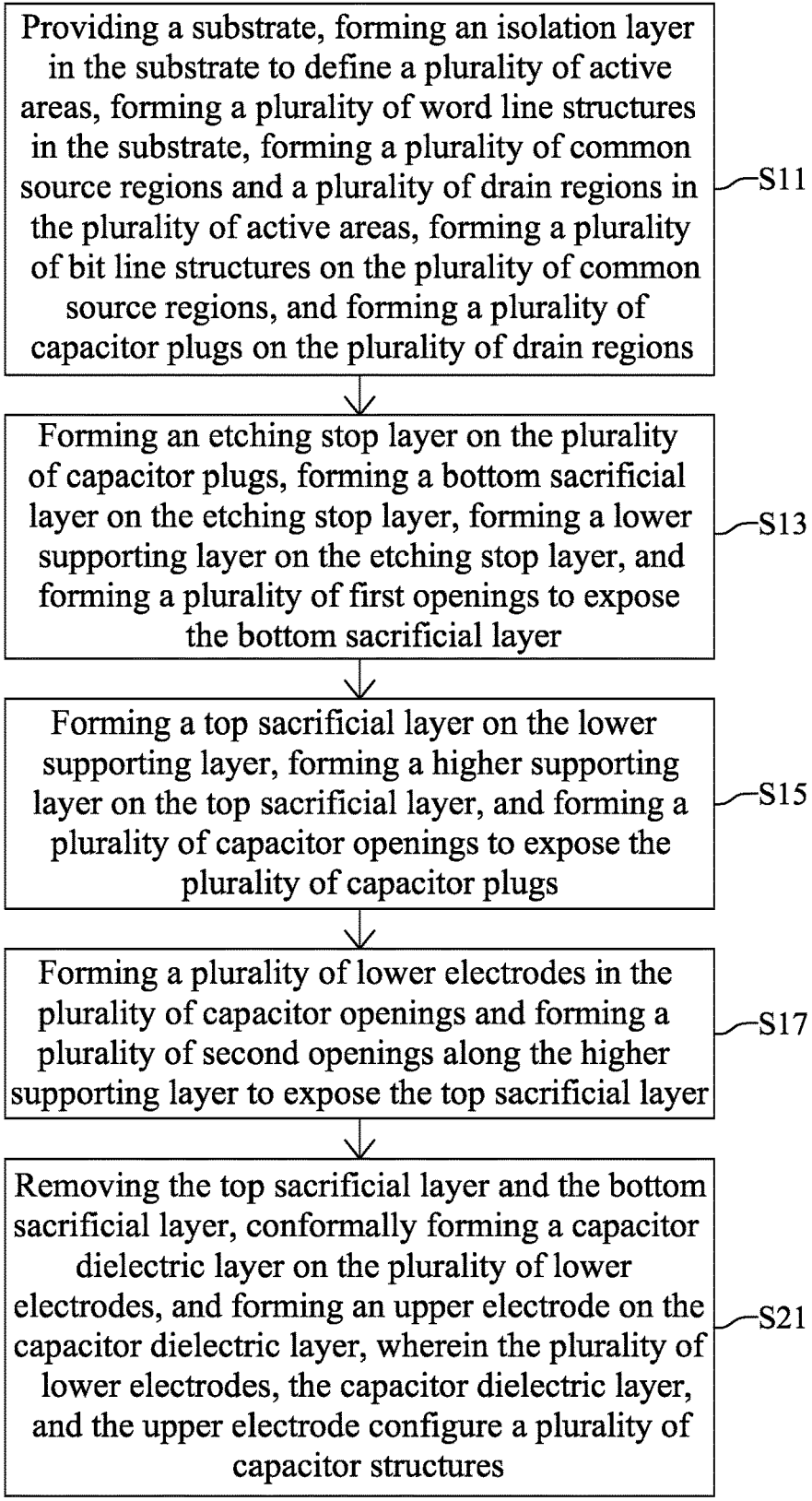
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the Z axis, and below (or down) corresponds to the opposite direction of the arrow of the Z axis.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
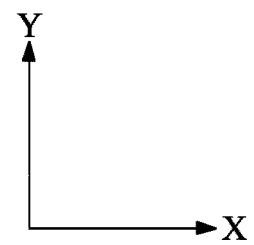
FIG. 2 illustrates, in a schematic top-view diagram, an intermediate semiconductor device in accordance with one embodiment of the present disclosure.
Figure 2:
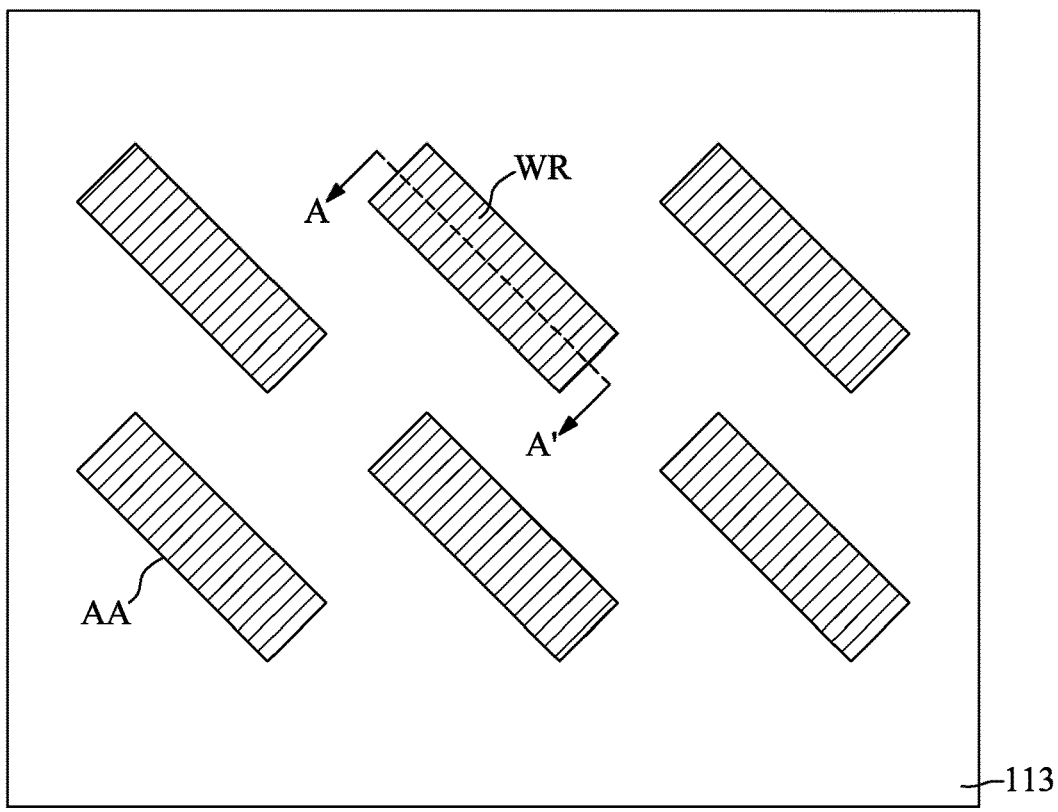
Figure 3:
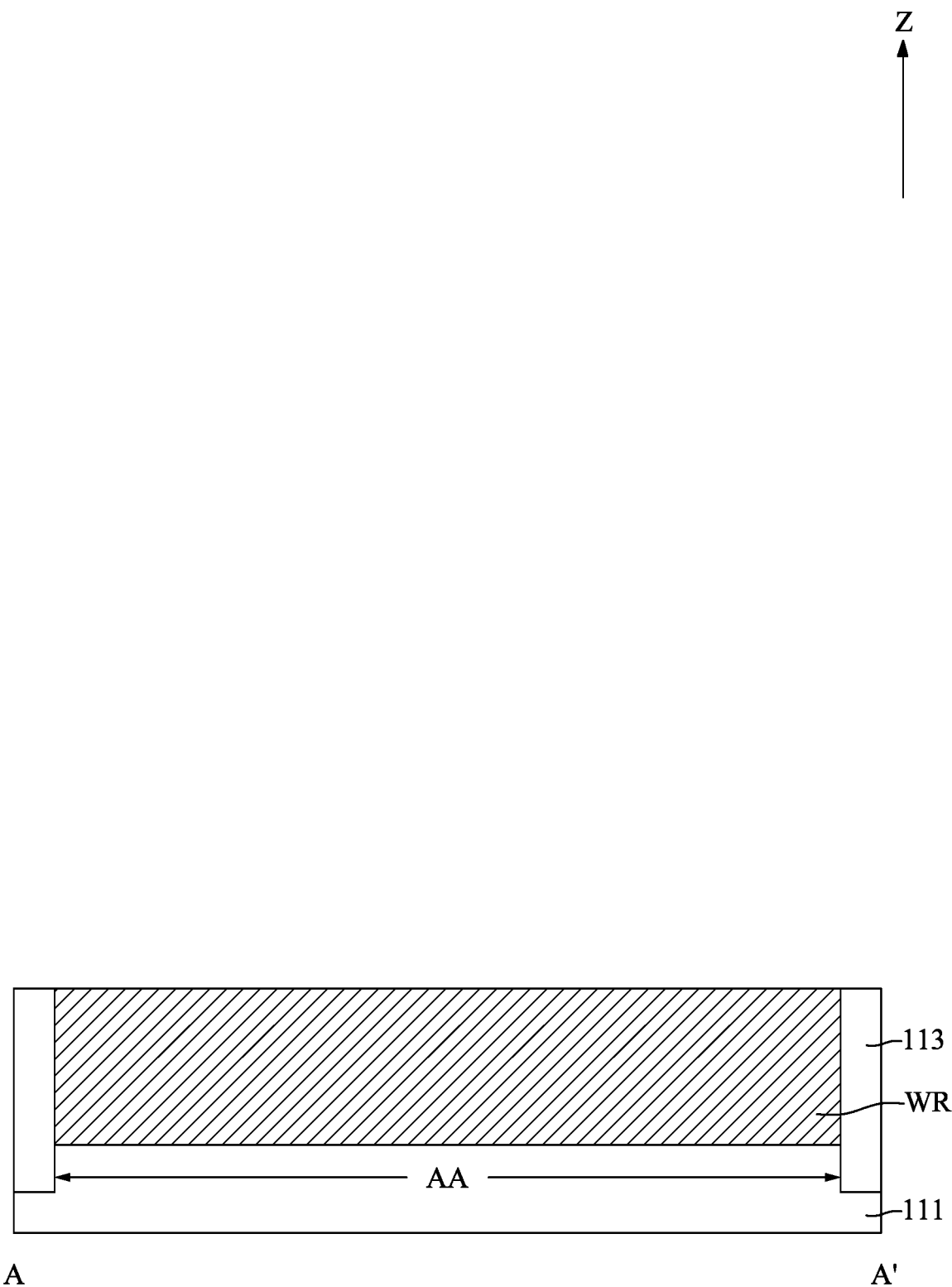
FIG. 3 is a schematic cross-sectional view diagram taken along the line A-A' line in FIG. 2 illustrating part of a flow for fabricating the semiconductor device in accordance with one embodiment of the present disclosure.
Figure 4:
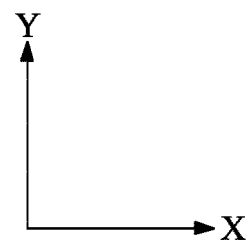
FIG. 4 illustrates, in a schematic top-view diagram, an intermediate semiconductor device in accordance with one embodiment of the present disclosure.
Figure 4:
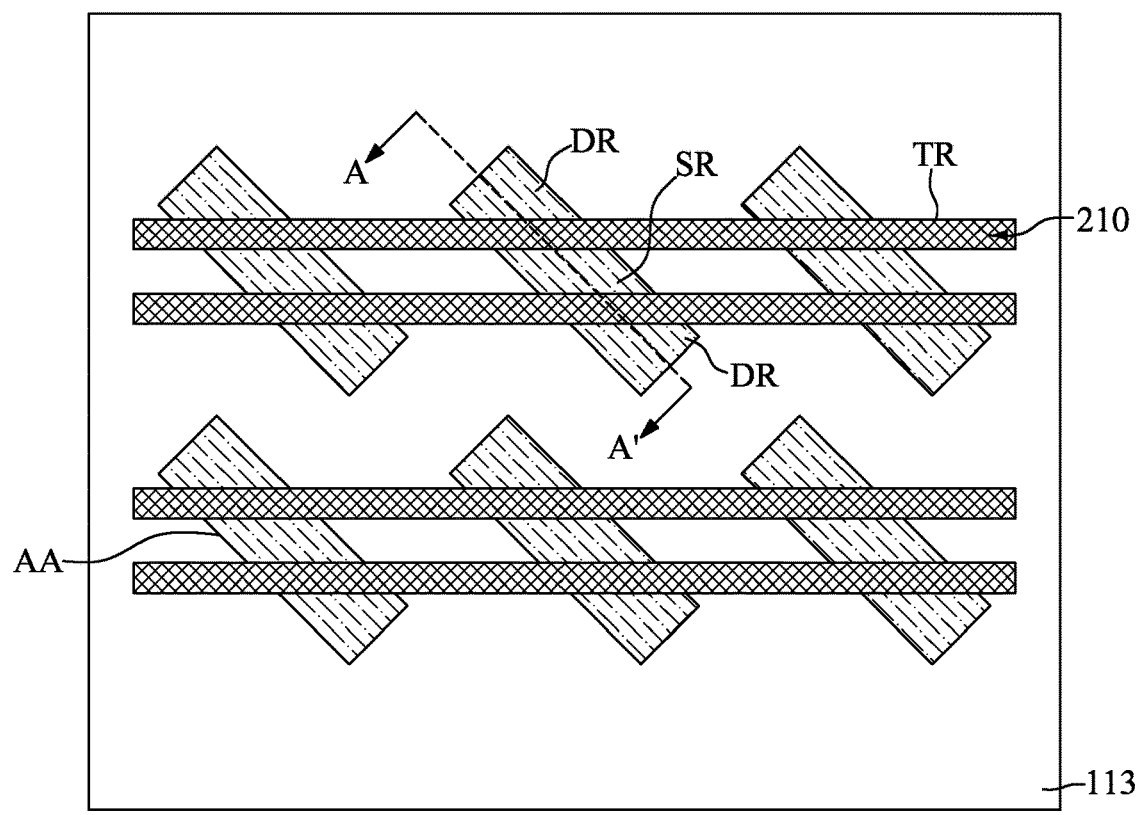
Figure 5:
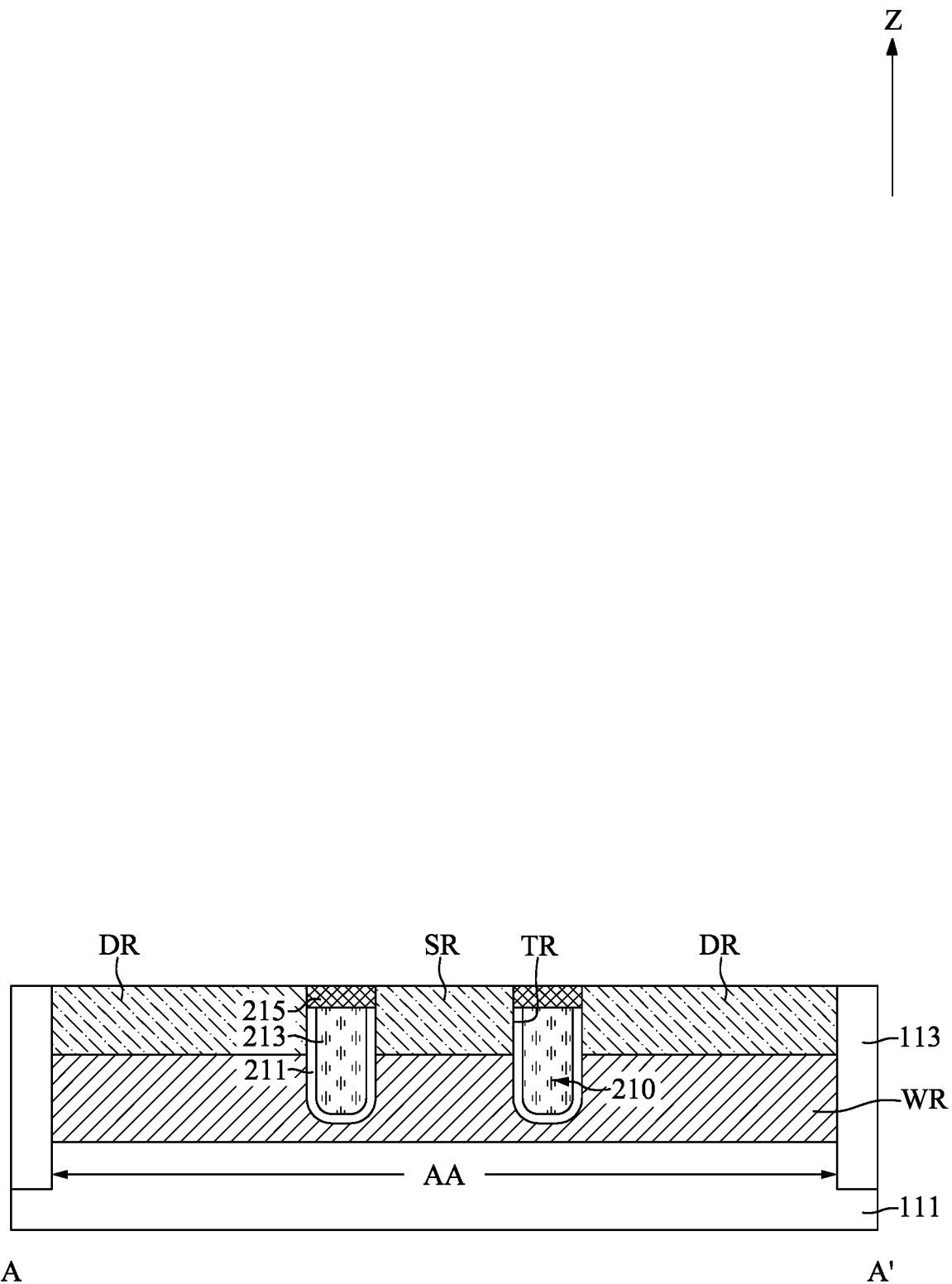
FIG. 5 is a schematic cross-sectional view diagram taken along the line A-A' line in FIG. 4 illustrating part of the flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along the line A-A' line in FIG. 2 illustrating part of a flow for fabricating the semiconductor device 1A in accordance with one embodiment of the present disclosure. FIG. 4 illustrates, in a schematic top-view diagram, an intermediate semiconductor device in accordance with one embodiment of the present disclosure. FIG. 5 is a schematic cross-sectional view diagram taken along the line A-A' line in FIG. 4 illustrating part of the flow for fabricating the semiconductor device 1A in accordance with one embodiment of the present disclosure.

With reference to FIGS. 1 to 9, at step S11, a substrate 111 may be provided, an isolation layer 113 may be formed in the substrate 111 to define a plurality of active areas AA, a plurality of word line structures 210 may be formed in the substrate 111, a plurality of common source regions SR and a plurality of drain regions DR may formed in the plurality of active areas AA, a plurality of bit line structures 310 may be formed on the plurality of common source regions SR, and a plurality of capacitor plugs 411 may be formed on the plurality of drain regions DR.

With reference to FIGS. 2 and 3, in some embodiments, the substrate 111 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 111 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 111 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, a series of deposition processes may be performed to deposit a pad oxide layer (not shown for clarity) and a pad nitride layer (not shown for clarity) on the substrate 111. A photolithography process may be performed to define the position of the isolation layer 113. After the photolithography process, an etch process, such as an anisotropic dry etch process, may be performed to form trenches penetrating through the pad oxide layer, the pad nitride layer, and extending to the substrate 111. An insulating material such as silicon oxide, silicon nitride, silicon oxynitride, or silicon nitride oxide may be deposited into the trenches and a planarization process, such as chemical mechanical polishing, may be subsequently performed to remove excess filling material until a top surface of the substrate 111 is exposed so as to form the isolation layer 113. The top surface of the isolation layer 113 and the top surface of the substrate 111 may be substantially coplanar.

With reference to FIGS. 2 and 3, the isolation layer 113 may define the plurality of active areas AA. In some embodiments, the plurality of active areas AA may extend along a direction slant with respect to the X axis and the Y axis in a top-view perspective.

It should be noted that each of the active areas AA may comprise a portion of the substrate 111 and a space above the portion of the substrate 111. Describing an element as being disposed on the active area AA means that the element is disposed on a top surface of the portion of the substrate 111. Describing an element as being disposed in the active area AA means that the element is disposed in the portion of the substrate 111; however, a top surface of the element may be even with the top surface of the portion of the substrate 111. Describing an element as being disposed above the active area AA means that the element is disposed above the top surface of the portion of the substrate 111.

It should be noted that, in the description of the present disclosure, a surface of an element (or a feature) located at the highest vertical level along the Z axis is referred to as a top surface of the element (or the feature). A surface of an element (or a feature) located at the lowest vertical level along the Z axis is referred to as a bottom surface of the element (or the feature).

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

For brevity, clarity, and convenience of description, only elements in one active area AA are described. All other active areas AA may have the same elements and may have the same configuration.

With reference to FIGS. 2 and 3, a well region WR may be formed in the active area AA. The well region WR may be formed by an implantation process using, for example, p-type dopants. The well region WR may have a first electrical type (e.g., the p-type). The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium and/or indium.

With reference to FIGS. 4 and 5, a plurality of impurity regions (not shown for clarity) may be formed in the plurality of active areas AA, respectively and correspondingly. The plurality of impurity regions may be formed by an implantation process. The implantation process may employ, for example, n-type dopants. The n-type dopants may be added to an intrinsic semiconductor to contribute free electrons to the intrinsic semiconductor. In a silicon-containing substrate, examples of n-type dopants, i.e., impurities, include but are not limited to antimony, arsenic, and phosphorus. The plurality of impurity regions may have a second electrical type (e.g., the n-type) opposite to the first electrical type. In some embodiments, the dopant concentration of the plurality of impurity regions may be between about 1E19 atoms/cm^3 and about 1E21 atoms/cm^3; although other dopant concentrations that are lesser than, or greater than, the aforementioned range may also be employed in the present disclosure.

In some embodiments, an annealing process may be performed to activate the plurality of impurity regions. The annealing process may have a process temperature between about 800° C. and about 1250° C. The annealing process may have a process duration between about 1 millisecond and about 500 milliseconds. The annealing process may be, for example, a rapid thermal annealing, a laser spike annealing, or a flash lamp annealing.

With reference to FIGS. 4 and 5, a plurality of word line trenches TR may be formed in the plurality of active areas AA to define the position of the plurality of word line structures 210. Detailedly, the plurality of word line trenches TR may be formed by a photolithography process and a following etch process. In some embodiments, the plurality of word line trenches TR may have a line shape and extend along the X axis and traversing the plurality of active areas AA in a top-view perspective. For example, each active area AA may be intersected with two word line trenches TR. Each of the plurality of impurity regions may be divided into the two drain regions DR and one common source region SR by the two word line trenches TR. The two drain regions DR may be respectively formed between the two word line trenches TR and the isolation layer 113. The common source region SR may be formed between the two word line trenches TR. The electric type and the dopant concentration of the two drain regions DR and the common source region SR are the same as the electric type and the dopant concentration of the plurality of impurity regions.

With reference to FIGS. 4 and 5, the plurality of word line structures 210 (e.g., two word line structures 210) may be formed in the two word line trenches TR, respectively and correspondingly. For brevity, clarity, and convenience of description, only one word line structure 210 is described. The word line structure 210 may include a word line dielectric layer 211, a word line conductive layer 213, and a word line capping layer 215.

With reference to FIGS. 4 and 5, the word line dielectric layer 211 may be conformally formed on the surface of the word line trench TR. The word line dielectric layer 401 may have a U-shaped cross-sectional profile. In other words, the word line dielectric layer 211 may be inwardly formed in the active area AA. In some embodiments, the word line dielectric layer 211 may be formed by a thermal oxidation process. For example, the word line dielectric layer 211 may be formed by oxidizing the surface of the word line trench TR. In some embodiments, the word line dielectric layer 211 may be formed by a deposition process such as a chemical vapor deposition or an atomic layer deposition. The word line dielectric layer 211 may include a high-k material, an oxide, a nitride, an oxynitride or combinations thereof. In some embodiments, after a liner polysilicon layer (not shown for clarity) is deposited, the word line dielectric layer 211 may be formed by radical-oxidizing the liner polysilicon layer. In some embodiments, after a liner silicon nitride layer (not shown for clarity) is formed, the word line dielectric layer 211 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIGS. 4 and 5, the word line conductive layer 213 may be formed on the word line dielectric layer 211. In some embodiments, in order to form the word line conductive layer 213, a conductive layer (not shown for clarity) may be formed to fill the word line trench TR, and a recessing process may be subsequently performed. The recessing process may be performed as an etch-back process or sequentially performed as the planarization process and an etch-back process. The word line conductive layer 213 may have a recessed shape that partially fills the word line trench TR.

In some embodiments, the word line conductive layer 213 may include a metal, a metal nitride, or a combination thereof. For example, the word line conductive layer 213 may be formed of titanium nitride, tungsten, or a titanium nitride/tungsten. After the titanium nitride is conformally formed, the titanium nitride/tungsten may have a structure where the word line trench TR is partially filled using tungsten. The titanium nitride or the tungsten may be solely used for the word line conductive layer 213. In some embodiments, the word line conductive layer 213 may be formed of, for example, a conductive material such as polycrystalline silicon, polycrystalline silicon germanium, or a combination thereof. In some embodiments, the word line conductive layer 213 may be doped with a dopant such as phosphorus, arsenic, antimony, or boron. In some embodiments, the word line conductive layer 213 may be formed of, for example, word line conductive layer 213 tungsten, aluminum, titanium, copper, the like, or a combination thereof.

With reference to FIGS. 4 and 5, a dielectric material (not shown) may be deposited by, for example chemical vapor deposition, to completely fill the word line trenches TR and covering the top surface of the substrate 111. A planarization process, such as chemical mechanical polishing, may be performed to provide a substantially flat surface for subsequent processing steps and form the word line capping layer 215. In some embodiments, the word line capping layer 215 may be formed of, for example, silicon oxide, silicon nitride, or other applicable dielectric material.

Figure 6:
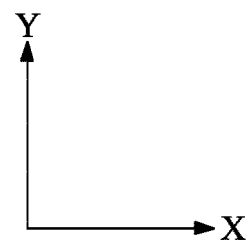
FIG. 6 illustrates, in a schematic top-view diagram, an intermediate semiconductor device in accordance with one embodiment of the present disclosure.
Figure 6:
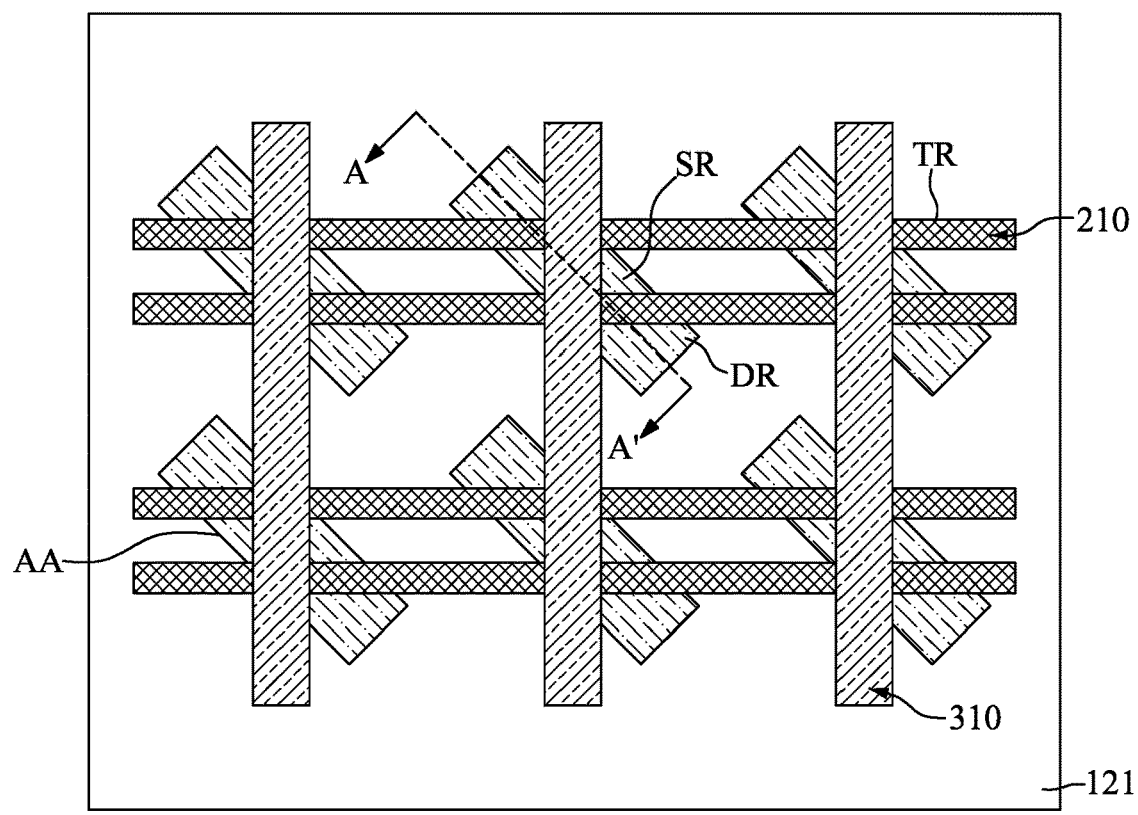
Figure 7:
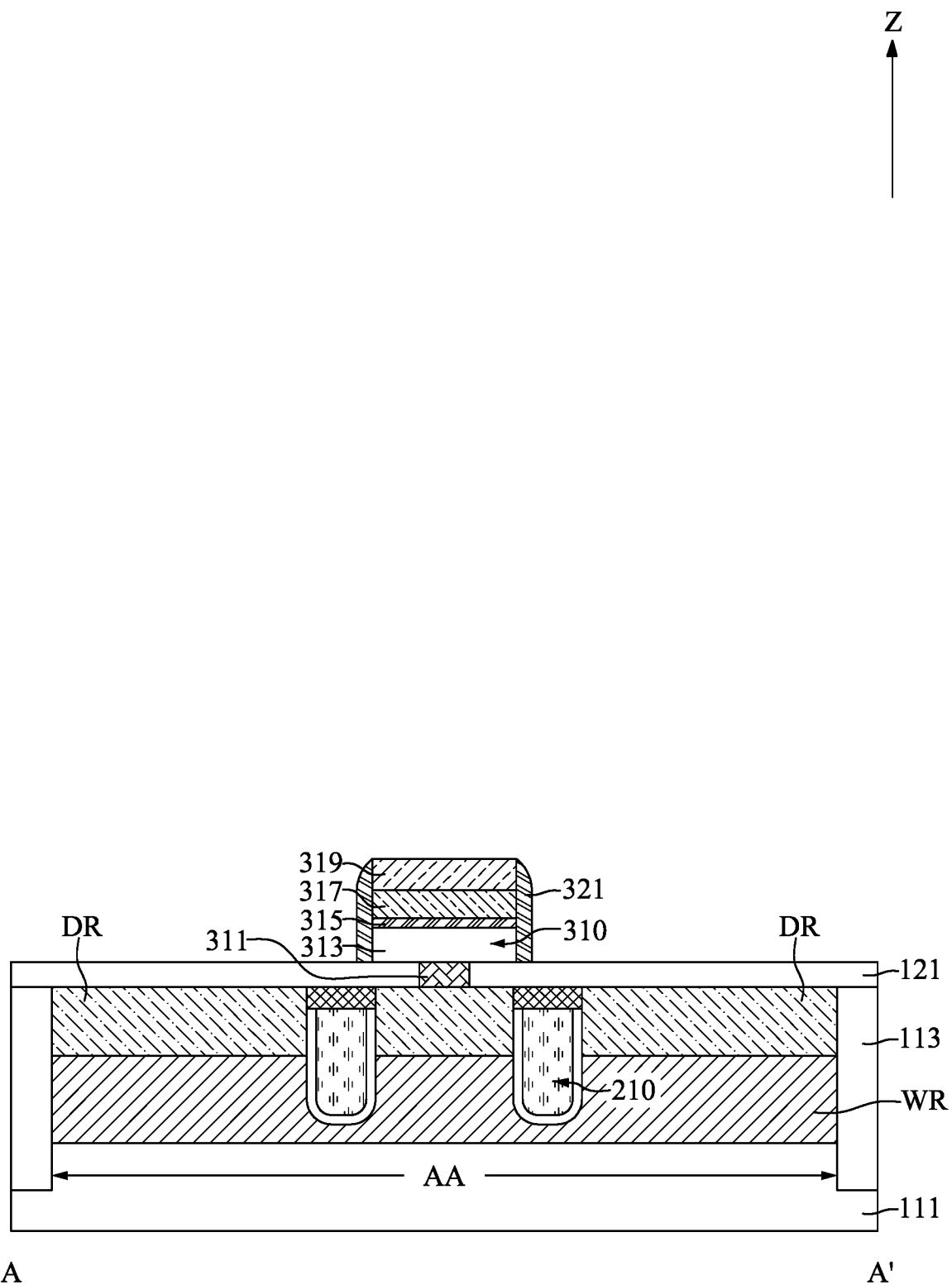
FIG. 7 is a schematic cross-sectional view diagram taken along the line A-A' line in FIG. 6 illustrating part of the flow for fabricating the semiconductor device in accordance with one embodiment of the present disclosure.
Figure 8:
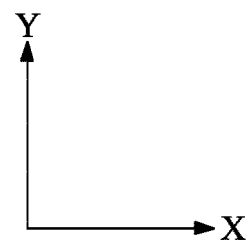
FIG. 8 illustrates, in a schematic top-view diagram, an intermediate semiconductor device in accordance with one embodiment of the present disclosure.
Figure 8:
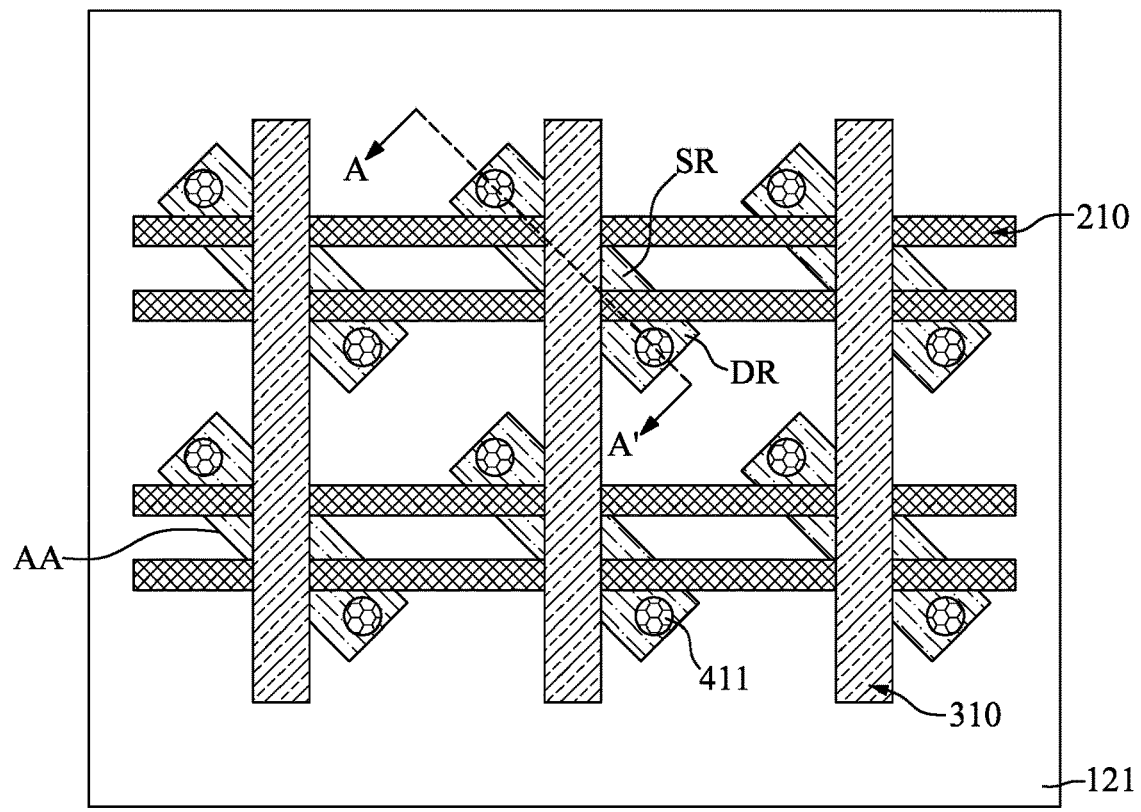
Figure 9:
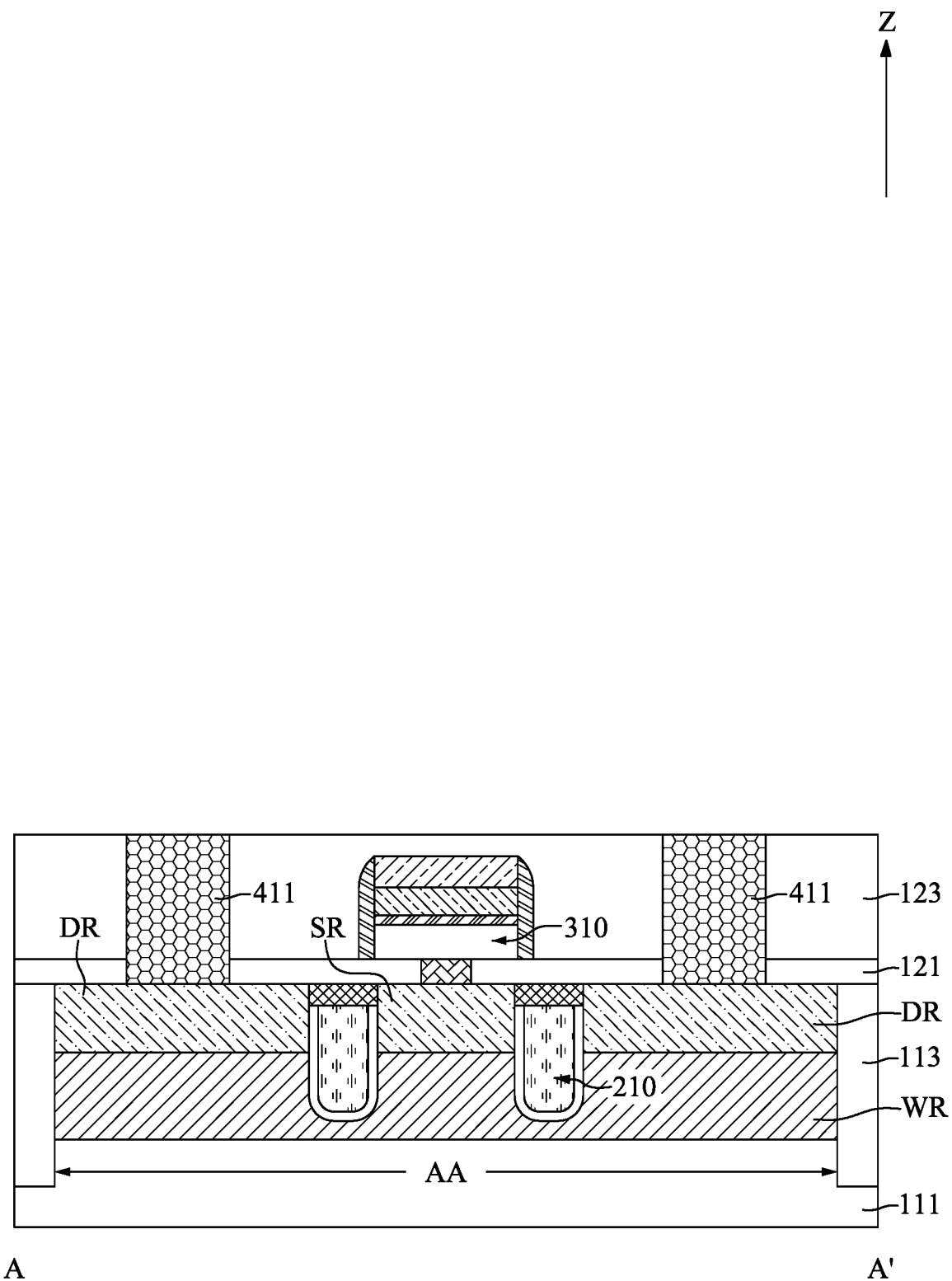
FIGS. 9 and 10 are schematic cross-sectional view diagrams taken along the line A-A' line in FIG. 8 illustrating part of the flow for fabricating the semiconductor device in accordance with one embodiment of the present disclosure.
Figure 10:
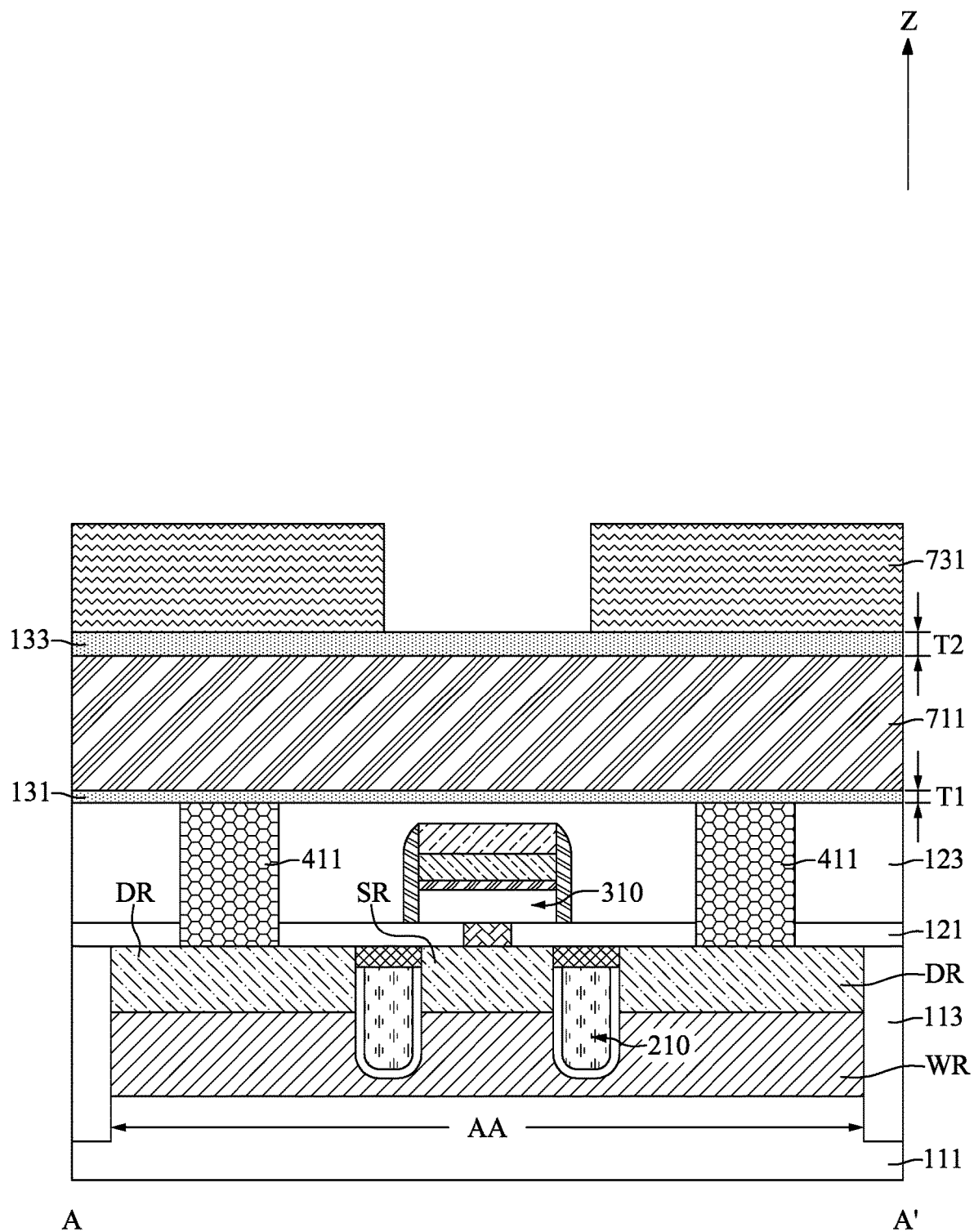

FIG. 6 illustrates, in a schematic top-view diagram, an intermediate semiconductor device in accordance with one embodiment of the present disclosure. FIG. 7 is a schematic cross-sectional view diagram taken along the line A-A' line in FIG. 6 illustrating part of the flow for fabricating the semiconductor device 1A in accordance with one embodiment of the present disclosure. FIG. 8 illustrates, in a schematic top-view diagram, an intermediate semiconductor device in accordance with one embodiment of the present disclosure. FIGS. 9 and 10 are schematic cross-sectional view diagrams taken along the line A-A' line in FIG. 8 illustrating part of the flow for fabricating the semiconductor device 1A in accordance with one embodiment of the present disclosure.

With reference to FIGS. 6 and 7, a bottom inter-dielectric layer 121 may be formed on the substrate 111. In some embodiments, the bottom inter-dielectric layer 121 may be, for example, silicon oxide or a high-k material. In some embodiments, the bottom inter-dielectric layer 121 may be formed by, for example, chemical vapor deposition, atomic layer deposition, or other applicable deposition process.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIGS. 6 and 7, the plurality of bit line structures 310 may be formed on the plurality of common source regions SR, respectively and correspondingly. For brevity, clarity, and convenience of description, only one bit line structure 310 is described. The bit line structure 310 may intersect with the plurality of word line structures 210 along the Y axis in a top-view perspective.

With reference to FIGS. 6 and 7, the bit line structure 310 may include a bit line contact 311, a bit line bottom conductive layer 313, a bit line middle conductive layer 315, a bit line top conductive layer 317, a bit line capping layer 319, and a plurality of bit line spacers 321. The bit line contact 311 may be formed along the bottom inter-dielectric layer 121 to contact the common source region SR. In some embodiments, the bit line contact 311 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 6 and 7, the bit line bottom conductive layer 313 may be formed on the bit line contact 311. In some embodiments, the bit line bottom conductive layer 313 may be formed of, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the bit line bottom conductive layer 313 may include dopants such as boron, aluminum, gallium, indium, antimony, arsenic, or phosphorus.

With reference to FIGS. 6 and 7, the bit line middle conductive layer 315 may be formed on the bit line bottom conductive layer 313. In some embodiments, the bit line bottom conductive layer 313 may be formed of, for example, titanium silicide, nickel silicide, nickel platinum silicide, tantalum silicide, or cobalt silicide. In some embodiments, the bit line middle conductive layer 315 may have a thickness between about 2 nm and about 20 nm.

With reference to FIGS. 6 and 7, the bit line top conductive layer 317 may be formed on the bit line middle conductive layer 315. In some embodiments, the bit line top conductive layer 317 may be formed of, for example, titanium, nickel, platinum, tantalum, cobalt, silver, copper, aluminum, other applicable conductive material, or a combination thereof.

With reference to FIGS. 6 and 7, the bit line capping layer 319 may be formed on the bit line top conductive layer 317. In some embodiments, the bit line capping layer 319 may be formed of, for example, silicon oxide, silicon nitride, silicon nitride oxide, silicon oxynitride, or other applicable insulating material.

With reference to FIGS. 6 and 7, the plurality of bit line spacers 321 may be formed on sidewalls of the bit line bottom conductive layer 313, the bit line middle conductive layer 315, the bit line top conductive layer 317, and the bit line capping layer 319. In some embodiments, the plurality of bit line spacers 321 may be formed of, for example, silicon oxide, silicon nitride, silicon oxynitride, silicon nitride oxide, or other applicable insulating material.

With reference to FIGS. 8 and 9, a top inter-dielectric layer 123 may be formed over the substrate 111 to cover the bit line structure 310. A planarization process, such as chemical mechanical polishing, may be performed to remove excess material and provide a substantially flat surface for subsequent processing steps. The top inter-dielectric layer 123 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the top inter-dielectric layer 123 may include a self-planarizing material such as a spin-on glass or a spin-on low-k dielectric material such as SiLK™. In some embodiments, the top inter-dielectric layer 123 may be formed by a deposition process including, for example, chemical vapor deposition, plasma enhanced chemical vapor deposition, evaporation, or spin-on coating.

With reference to FIGS. 8 and 9, the plurality of capacitor plugs 411 may be formed along the top inter-dielectric layer 123 and the bottom inter-dielectric layer 121, and on the plurality of drain regions DR. In some embodiments, the plurality of capacitor plugs 411 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 11:
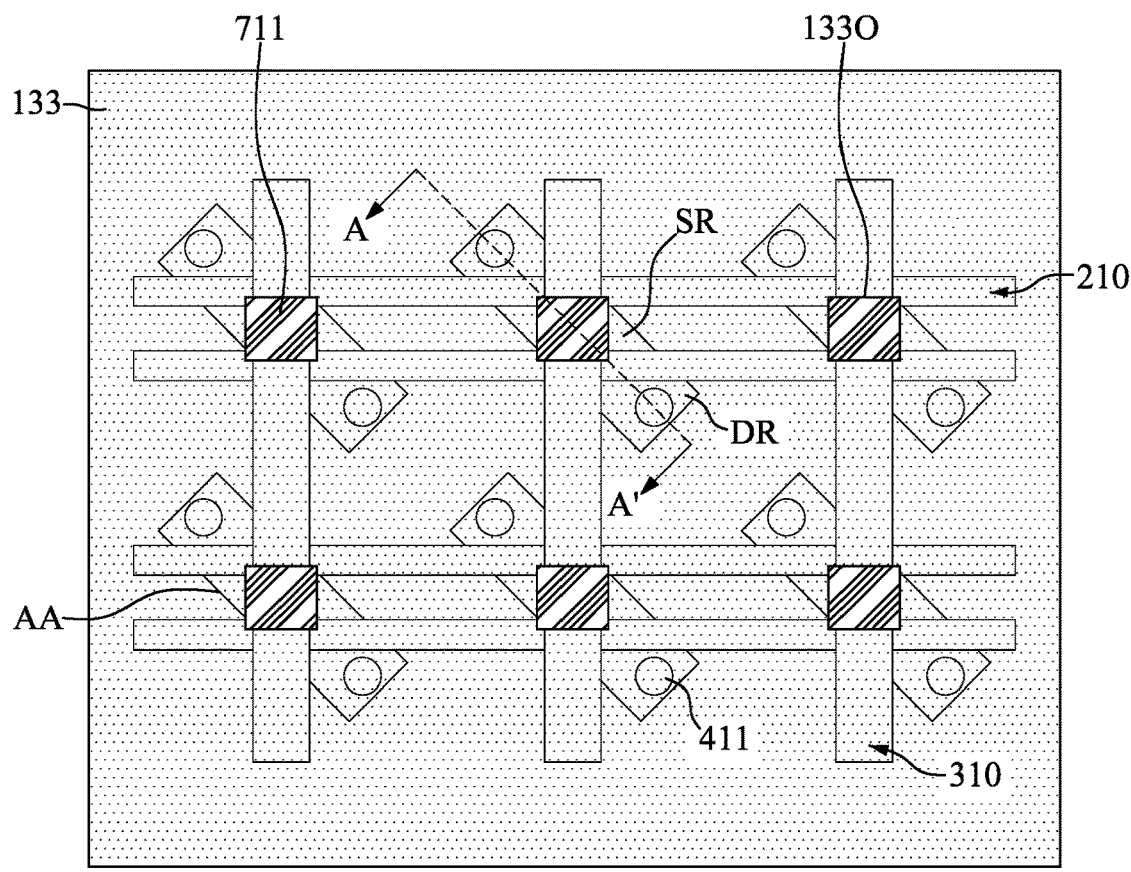
FIG. 11 illustrates, in a schematic top-view diagram, an intermediate semiconductor device in accordance with one embodiment of the present disclosure.
Figure 12:
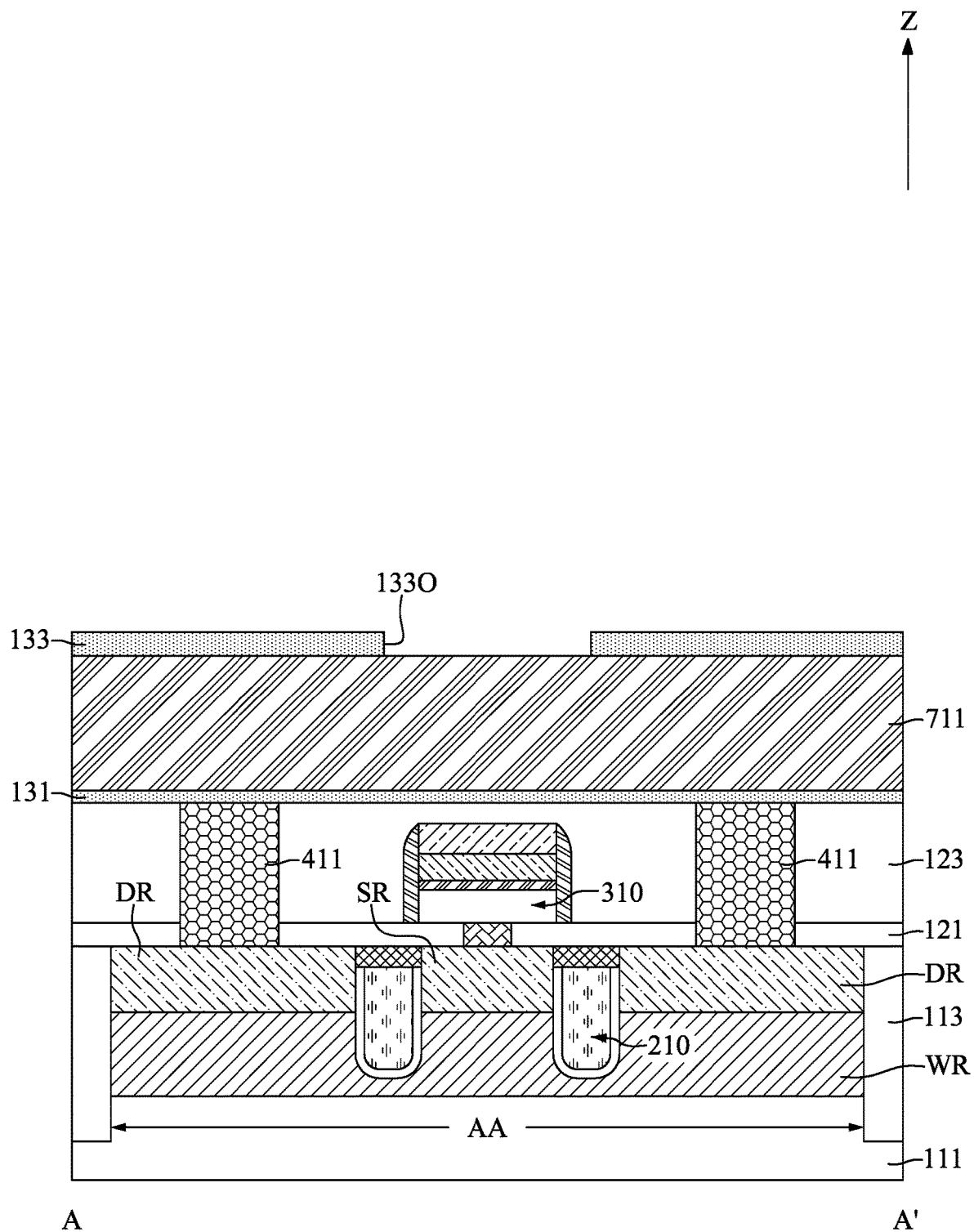
FIG. 12 is a schematic cross-sectional view diagram taken along the line A-A' line in FIG. 11 illustrating part of the flow for fabricating the semiconductor device in accordance with one embodiment of the present disclosure.

FIG. 11 illustrates, in a schematic top-view diagram, an intermediate semiconductor device in accordance with one embodiment of the present disclosure. FIG. 12 is a schematic cross-sectional view diagram taken along the line A-A' line in FIG. 11 illustrating part of the flow for fabricating the semiconductor device 1A in accordance with one embodiment of the present disclosure.

With reference to FIG. 1 and FIGS. 10 to 12, at step S13, an etching stop layer 131 may be formed on the plurality of capacitor plugs 411, a bottom sacrificial layer 711 may be formed on the etching stop layer 131, a lower supporting layer 133 may be formed on the etching stop layer 131, and a plurality of first openings 133O may be formed to expose the bottom sacrificial layer 711.

With reference to FIG. 10, the etching stop layer 131 may be formed on the top inter-dielectric layer 123 and may cover the plurality of capacitor plugs 411. Generally, the etching stop layer 131 may provide a mechanism to stop an etch process when forming conductive features. The etching stop layer 131 may be preferably formed of a dielectric material having a different etch selectivity from adjacent layers. For example, the etching stop layer 131 may be formed of silicon nitride, silicon carbonitride, silicon oxycarbide, or the like. The etching stop layer 131 may be deposited by chemical vapor deposition or plasma enhanced chemical vapor deposition. In the present embodiment, the etching stop layer 131 is formed of silicon nitride.

With reference to FIG. 10, the bottom sacrificial layer 711 may be formed on the etching stop layer 131. In some embodiments, the bottom sacrificial layer 711 may be formed of a material having an etching selectivity to the etching stop layer 131. In some embodiments, the bottom sacrificial layer 711 may be formed of, for example, silicon oxide, silicon nitride, silicon oxide nitride, silicon nitride oxide, borophosphosilicate glass, undoped silicate glass, fluorinated silicate glass, or the like. In the present embodiment, the bottom sacrificial layer 711 may be formed of borophosphosilicate glass.

With reference to FIG. 10, the lower supporting layer 133 may be formed on the bottom sacrificial layer 711. In some embodiments, the lower supporting layer 133 may be formed of a material having an etching selectivity to the bottom sacrificial layer 711. In some embodiments, the lower supporting layer 133 may be formed of a same material as the etching stop layer 131 but is not limited thereto. In some embodiments, the lower supporting layer 133 may be formed of silicon nitride, silicon carbonitride, silicon oxycarbide, or the like. The lower supporting layer 133 may be deposited by chemical vapor deposition or plasma enhanced chemical vapor deposition. In the present embodiment, the lower supporting layer 133 is formed of silicon nitride.

In some embodiments, the thickness T2 of the lower supporting layer 133 and the thickness T1 of the etching stop layer 131 may be substantially the same. In some embodiments, the thickness T2 of the lower supporting layer 133 and the thickness T1 of the etching stop layer 131 may be different. For example, the thickness T2 of the lower supporting layer 133 may be greater than the thickness T1 of the etching stop layer 131.

With reference to FIG. 10, a first mask layer 731 may be formed on the lower supporting layer 133. In some embodiments, the first mask layer 731 may be a photoresist layer. The first mask layer 731 may include the pattern which defines the position and profile of the plurality of first openings 133O.

With reference to FIGS. 11 and 12, a first etching process may be performed using the first mask layer 731 as a mask to remove portions of the lower supporting layer 133 and form the plurality of first openings 133O. The etch rate ratio of the lower supporting layer 133 to the bottom sacrificial layer 711 may be between about 100:1 and about 1.05:1, between about 15:1 and about 2:1, or between about 10:1 and about 2:1 during the first etching process.

For brevity, clarity, and convenience of description, only one first opening 133O is described. In some embodiments, the shape of the first opening 133O may be, for example, square, rectangular, circular, or other applicable shape in a top-view perspective. In some embodiments, the first opening 133O may be topographically aligned with the active area AA. Detailedly, the first opening 133O may be topographically aligned with the common source region SR and/or the bit line structure 310. The first opening 133O may be overlapped or partially overlapped with the common source region SR in a top-view perspective. The first opening 133O may be partially overlapped with the bit line structure 310 in a top-view perspective. In some embodiments, the first opening 133O may be partially overlapped with the word line structure 210.

Alternatively, the first opening 133O may not be topographically aligned with the active area AA, the common source region SR, the bit line structure 310, and the word line structure 210. In other words, the first opening 133O may not be overlapped with the active area AA, the common source region SR, the bit line structure 310, and the word line structure 210 in a top-view perspective (not shown).

In the description of the present disclosure, an x-y-z coordinate system is assumed where x and y refer to dimensions within the plane parallel to the major surface of the structure and z refers a dimension perpendicular to the plane, two features are topographically aligned when those features have substantially the same x, y coordinates.

Figure 13:
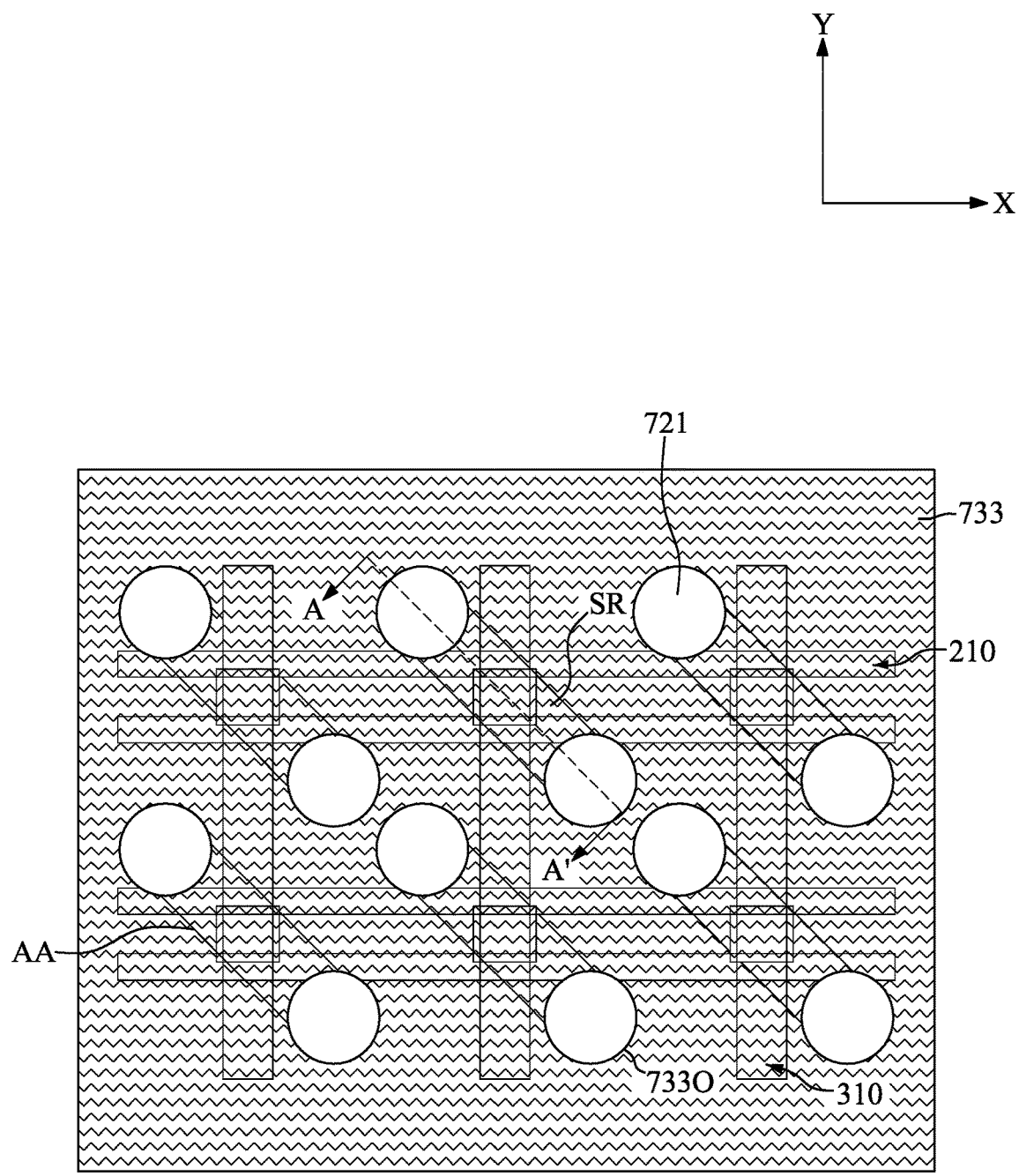
FIG. 13 illustrates, in a schematic top-view diagram, an intermediate semiconductor device in accordance with one embodiment of the present disclosure.

FIG. 13 illustrates, in a schematic top-view diagram, an intermediate semiconductor device in accordance with one embodiment of the present disclosure. FIGS. 14 to 17 are schematic cross-sectional view diagrams taken along the line A-A' line in FIG. 13 illustrating part of the flow for fabricating the semiconductor device 1A in accordance with one embodiment of the present disclosure.

With reference to FIG. 1 and FIGS. 13 to 15, at step S15, a top sacrificial layer 713 may be formed on the lower supporting layer 133, a higher supporting layer 135 may be formed on the top sacrificial layer 713, and a plurality of capacitor openings 510O may be formed to expose the plurality of capacitor plugs 411.

Figure 14:
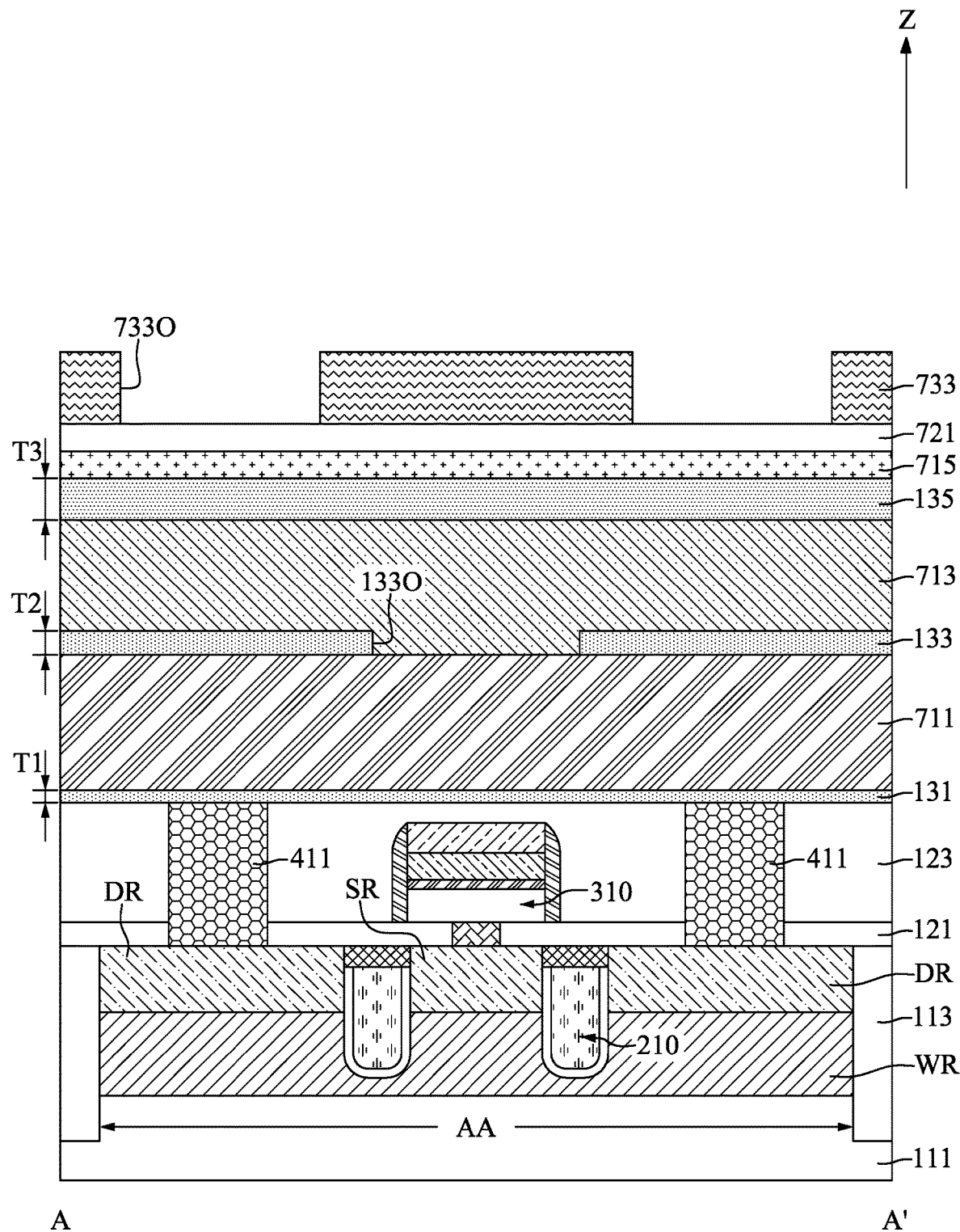
FIGS. 14 to 17 are schematic cross-sectional view diagrams taken along the line A-A' line in FIG. 13 illustrating part of the flow for fabricating the semiconductor device in accordance with one embodiment of the present disclosure.

With reference to FIGS. 13 and 14, the top sacrificial layer 713 may be formed on the lower supporting layer 133 and filling the plurality of first openings 133O. In some embodiments, the top sacrificial layer 713 may be formed of a material having an etching selectivity to the lower supporting layer 133. In some embodiments, the top sacrificial layer 713 may be formed of a material having an etching selectivity to the lower supporting layer 133 and/or the bottom sacrificial layer 711. In some embodiments, the top sacrificial layer 713 and the bottom sacrificial layer 711 may be formed of the same material. In some embodiments, the top sacrificial layer 713 may be formed of, for example, silicon oxide (depositing by using tetraethyl orthosilicate as a precursor), silicon nitride, silicon oxide nitride, silicon nitride oxide, borophosphosilicate glass, undoped silicate glass, fluorinated silicate glass, or the like. In the present embodiment, the top sacrificial layer 713 may be formed of silicon oxide.

In some embodiments, a planarization process, such as chemical mechanical polishing, may be performed on the top sacrificial layer 713 to remove excess material and provide a substantially flat surface for subsequent processing steps.

With reference to FIGS. 13 and 14, the higher supporting layer 135 may be formed on the top sacrificial layer 713. In some embodiments, the higher supporting layer 135 may be formed of a material having an etching selectivity to the top sacrificial layer 713. In some embodiments, the higher supporting layer 135 may be formed of a same material as the lower supporting layer 133 but is not limited thereto. In some embodiments, the higher supporting layer 135 may be formed of silicon nitride, silicon carbonitride, silicon oxycarbide, or the like. The higher supporting layer 135 may be deposited by chemical vapor deposition or plasma enhanced chemical vapor deposition. In the present embodiment, the higher supporting layer 135 is formed of silicon nitride.

In some embodiments, the thickness T3 of the higher supporting layer 135 and the thickness T2 of the lower supporting layer 133 may be substantially the same. In some embodiments, the thickness T3 of the higher supporting layer 135 and the thickness T2 of the lower supporting layer 133 may be different. For example, the thickness T3 of the higher supporting layer 135 may be greater than the thickness T2 of the lower supporting layer 133.

In some embodiments, the thickness T3 of the higher supporting layer 135 and the thickness T1 of the etching stop layer 131 may be substantially the same. In some embodiments, the thickness T3 of the higher supporting layer 135 and the thickness T1 of the etching stop layer 131 may be different. For example, the thickness T3 of the higher supporting layer 135 may be greater than the thickness T1 of the etching stop layer 131.

With reference to FIGS. 13 and 14, a buffer layer 715 may be formed on the higher supporting layer 135. In some embodiments, the buffer layer 715 may be formed of a material having an etching selectivity to the higher supporting layer 135. In some embodiments, the buffer layer 715 may be formed of a same material as the top sacrificial layer 713 but is not limited thereto. In some embodiments, the buffer layer 715 may be formed of silicon oxide, silicon nitride, silicon carbonitride, silicon oxycarbide, or other applicable insulating material. The buffer layer 715 may be deposited by chemical vapor deposition, plasma enhanced chemical vapor deposition, or atomic layer deposition. In the present embodiment, the buffer layer 715 is formed of a material different from the etching stop layer 131. For example, the buffer layer 715 is formed of silicon oxide.

With reference to FIGS. 13 and 14, a first hard mask layer 721 may be formed on the buffer layer 715. In some embodiments, the first hard mask layer 721 may be formed of, for example, silicon, silicon germanium, tetraethyl orthosilicate, silicon nitride, silicon oxynitride, silicon nitride oxide, silicon carbide, the like, or a combination thereof. The first hard mask layer 721 may be formed by a deposition process such as chemical vapor deposition, plasma-enhanced chemical vapor deposition, atomic layer deposition, or the like. The process temperature of forming the first hard mask layer 721 may be less than 400° C.

In some embodiments, the first hard mask layer 721 may be formed of, for example, boron nitride, silicon boron nitride, phosphorus boron nitride, boron carbon silicon nitride, or the like. The first hard mask layer 721 may be formed by a film formation process and a treatment process. Detailedly, in the film formation process, first precursors, which may be boron-based precursors, may be introduced over the pad oxide to form a boron-based layer. Subsequently, in the treatment process, second precursors, which may be nitrogen-based precursors, may be introduced to react with the boron-based layer and turn the boron-based layer into the first hard mask layer 721. In some embodiments, the first precursors may be, for example, diborane, borazine, or an alkyl-substituted derivative of borazine. In some embodiments, the second precursors may be, for example, ammonia or hydrazine.

In some embodiments, the first hard mask layer 721 may be formed of, for example, a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, the first hard mask layer 721 formed of the carbon film may be formed by a high-density plasma chemical vapor deposition process. The high-density plasma may be generated using inductively coupled radio frequency (RF) power in a range between about 500 watts and about 4000 watts. In some embodiments, the high-density plasma may be generated using a capacitively coupled RF power in a range between about 500 watts and about 4000 watts. The source of carbon may be methane, ethane, ethyne, benzene, or a combination thereof. The flow rate of the source of carbon may be between about 50 standard cubic feet per minute (sccm) and about 150 sccm. The source of carbon may provide polymerization of carbon to form carbon-carbon chains. An inert gas such as argon, neon, or helium may be used as carrier gas to carry the source of carbon. The flow rate of the carrier gas may be between about 10 sccm and about 150 sccm. The process pressure of the high-density plasma chemical vapor deposition process may be about 5 millitorr and about 20 millitorr. The process temperature of the high-density plasma chemical vapor deposition process may be between about 240° C. and about 340° C.

With reference to FIGS. 13 and 14, a second mask layer 733 may be formed on the first hard mask layer 721. In some embodiments, the second mask layer 733 may be a photoresist layer. The second mask layer 733 may include a plurality of openings 733O which defines the position and profile of the plurality of capacitor openings 510O. In some embodiments, the shape of the plurality of openings 733O may be circular, square, rectangular, or other applicable shape in a top-view perspective. In some embodiments, the plurality of openings 733O may be topographically aligned with the drain regions DR and the plurality of capacitor plugs 411. The plurality of openings 733O may be overlapped with the plurality of capacitor plugs 411 in a top-view perspective.

Figure 15:
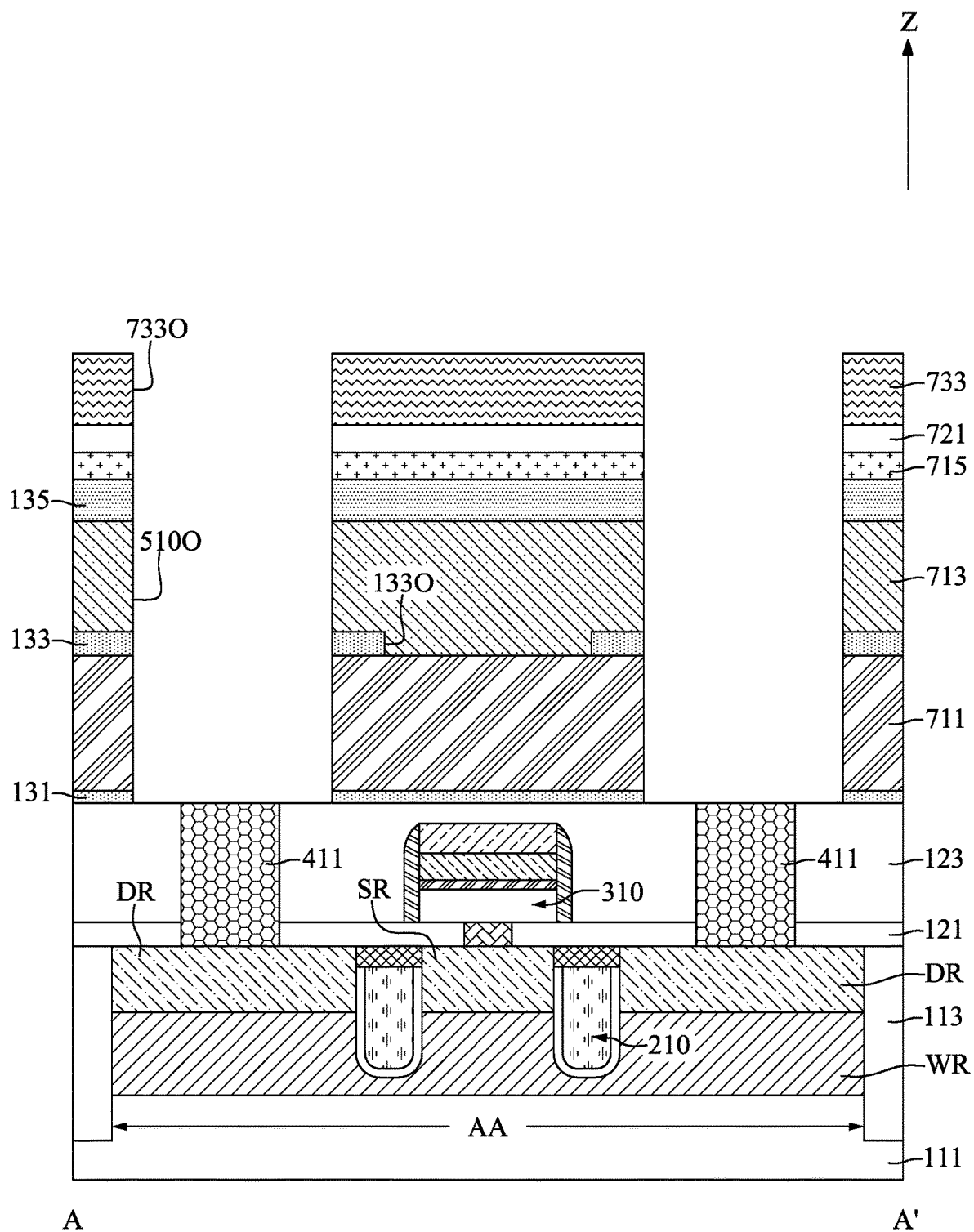

With reference to FIG. 15, in some embodiments, the pattern of the plurality of openings 733O may be transferred to the first hard mask layer 721. Then, the plurality of capacitor openings 510O may be formed using at least one of a wet etching process, a dry etching process, a mechanical drilling process, and a laser drilling process with the patterned first hard mask layer 721 as the mask. The second mask layer 733 may be removed after the formation of the plurality of capacitor openings 510O.

In some embodiments, the plurality of capacitor openings 510O may be topographically aligned with the plurality of capacitor plugs 411 and have a circular shape in a top-view perspective. The shape of the plurality of capacitor openings 510O may be dependent on the plurality of openings 733O.

That is, the shape of the plurality of capacitor openings 510O may be, for example, circular, square, rectangular, or other applicable shape in a top-view perspective.

With reference to FIG. 1 and FIGS. 16 to 22, at step S17, a plurality of lower electrodes 511 may be formed in the plurality of capacitor openings 510O and a plurality of second openings 135O may be formed along the higher supporting layer 135 to expose the top sacrificial layer 713.

Figure 16:
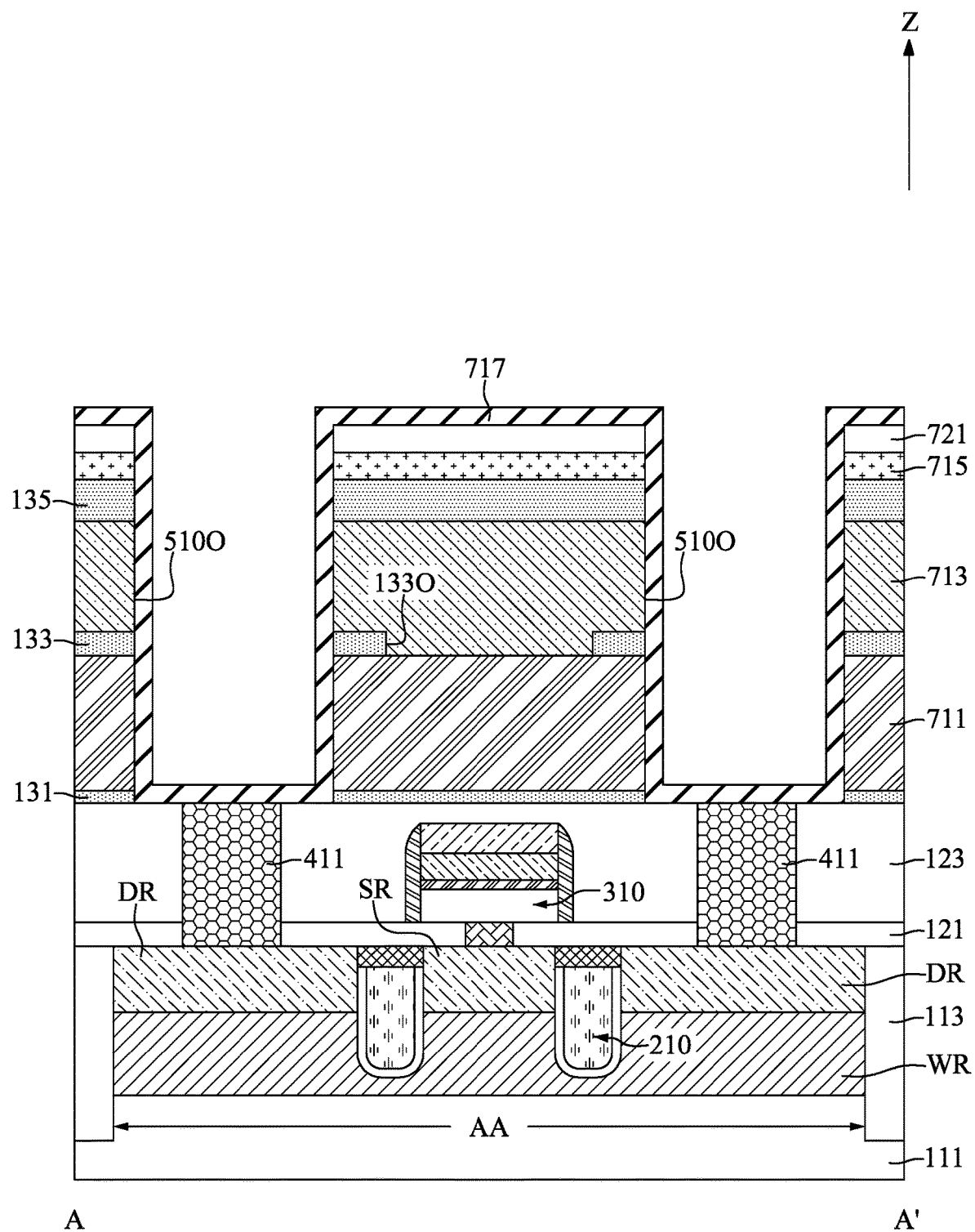

With reference to FIG. 16, a layer of first conductive material 717 may be conformally formed in the plurality of capacitor openings 510O and on the top surface of the first hard mask layer 721. In some embodiments, the first conductive material 717 may be, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The layer of first conductive material 717 may be formed by, for example, chemical vapor deposition, physical vapor deposition, sputtering, atomic layer deposition, the like, or other applicable deposition process.

Figure 17:
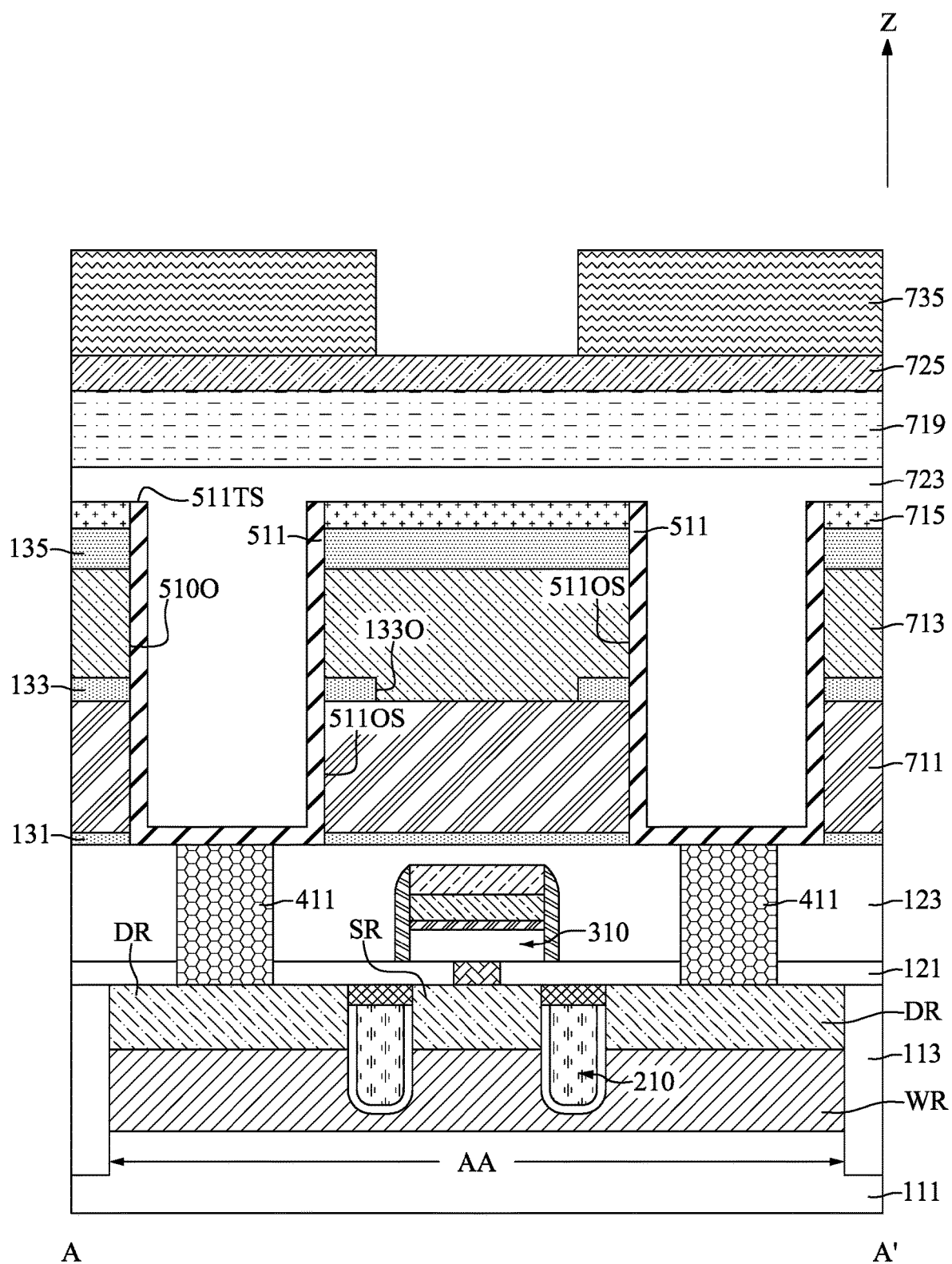

With reference to FIG. 17, a node separation process may be performed to remove the first hard mask layer 721 and a portion of the first conductive material 717. After the node separation process, the layer of first conductive material 717 may be turned into the plurality of lower electrodes 511, each one to correspond with one of the plurality of capacitor plugs 411. The node separation process may include etching or polishing the layer of first conductive material 717 and the first hard mask layer 721 to expose the top surface of the buffer layer 715.

For brevity, clarity, and convenience of description, only one lower electrode 511 is described.

In some embodiments, the lower electrode 511 may have a cup shape or a bottom-closed cylinder shape. In other words, the lower electrode 511 may include a U-shaped cross-sectional profile. The top surface 511TS of the lower electrode 511 and the top surface of the buffer layer 715 may be substantially coplanar. The etching stop layer 131 may be disposed against on the outer surfaces 511OS of the lower electrodes 511. The lower supporting layer 133 may be disposed against on the outer surfaces 511OS of the lower electrodes 511. The higher supporting layer 135 may be disposed against on the outer surfaces 511OS of the lower electrodes 511. The first opening 133O may be disposed between an adjacent pair of the lower electrodes 511.

With reference to FIG. 17, a second hard mask layer 723 may be formed to cover the buffer layer 715 and the plurality of lower electrodes 511. A portion of the second hard mask layer 723 may extend to fill inner spaces of the plurality of lower electrodes 511. In some embodiments, the second hard mask layer 723 may be formed of oxide (e.g., a silicon oxide layer) or nitride (e.g., a silicon nitride layer), and the formation thereof may be performed using a deposition process such as physical vapor deposition or a chemical vapor deposition.

In some embodiments, a planarization process, such as chemical mechanical polishing, may be performed on the second hard mask layer 723 to remove excess material and provide a substantially flat surface for subsequent processing steps.

With reference to FIG. 17, an underfill layer 719 may be formed on the second hard mask layer 723 by, for example, spin coating, chemical vapor deposition, or other suitable deposition process. In some embodiments, the underfill layer 719 may be formed of, for example, silicon carbonitride, silicon oxycarbide, or the like. In some embodiments, the underfill layer 719 may be composed of carbon and hydrogen. In some embodiments, the underfill layer 719 may be composed of carbon, hydrogen, and oxygen. In some embodiments, the underfill layer 719 may be composed of carbon, hydrogen, and fluorine. In some embodiments, the underfill layer 719 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. In some embodiments, the thickness of the underfill layer 719 may be between about 180 nm and about 220 nm, measured from the top surface of the second hard mask layer 723.

In some embodiments, the second hard mask layer 723 may be optional and the underfill layer 719 may fill inner spaces of the plurality of lower electrodes 511 and cover the top surface of the buffer layer 715.

With reference to FIG. 17, a third hard mask layer 725 may be formed on the underfill layer 719. In some embodiments, the thickness of the third hard mask layer 725 may be between about 10 nm and about 100 nm or between about 10 nm and about 50 nm. In some embodiments, the third hard mask layer 725 may be formed of, for example, silicon, silicon germanium, tetraethyl orthosilicate, silicon nitride, silicon oxynitride, silicon nitride oxide, silicon carbide, the like, or a combination thereof. The third hard mask layer 725 may be formed by a deposition process such as chemical vapor deposition, plasma-enhanced chemical vapor deposition, atomic layer deposition, or the like. The process temperature of forming the third hard mask layer 725 may be less than 400° C. In some embodiments, the third hard mask layer 725 may be formed of, for example, metal nitrides such as titanium nitride and tantalum nitride.

Alternatively, in some embodiments, the third hard mask layer 725 may be formed of, for example, boron nitride, silicon boron nitride, phosphorus boron nitride, boron carbon silicon nitride, or the like. The third hard mask layer 725 may be formed by a film formation process and a treatment process. Detailedly, in the film formation process, first precursors, which may be boron-based precursors, may be introduced over the underfill layer 719 to form a boron-based layer. Subsequently, in the treatment process, second precursors, which may be nitrogen-based precursors, may be introduced to react with the boron-based layer and turn the boron-based layer into the third hard mask layer 725. In some embodiments, the first precursors may be, for example, diborane, borazine, or an alkyl-substituted derivative of borazine. In some embodiments, the second precursors may be, for example, ammonia or hydrazine.

With reference to FIG. 17, a third mask layer 735 may be formed on the third hard mask layer 725. In some embodiments, the third mask layer 735 may be a photoresist layer. The third mask layer 735 may include the pattern which defines the position and profile of the plurality of second openings 135O. The third mask layer 735 may be patterned using a photomask (not shown) the same as when patterning the first mask layer 731. By re-using the photomask, the cost of fabrication of the semiconductor device 1A may be reduced.

Figure 18:
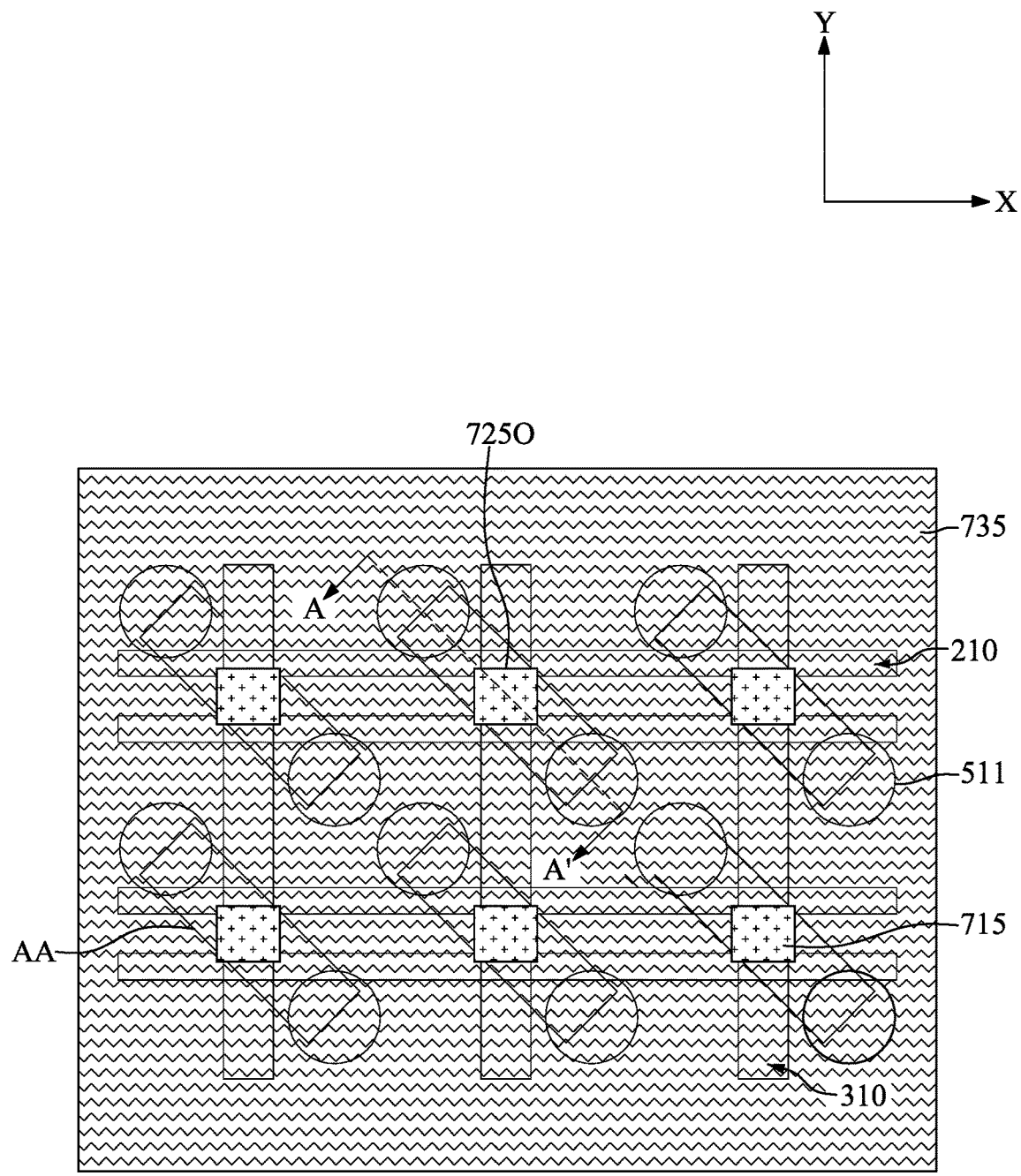
FIG. 18 illustrates, in a schematic top-view diagram, an intermediate semiconductor device in accordance with one embodiment of the present disclosure.
Figure 19:
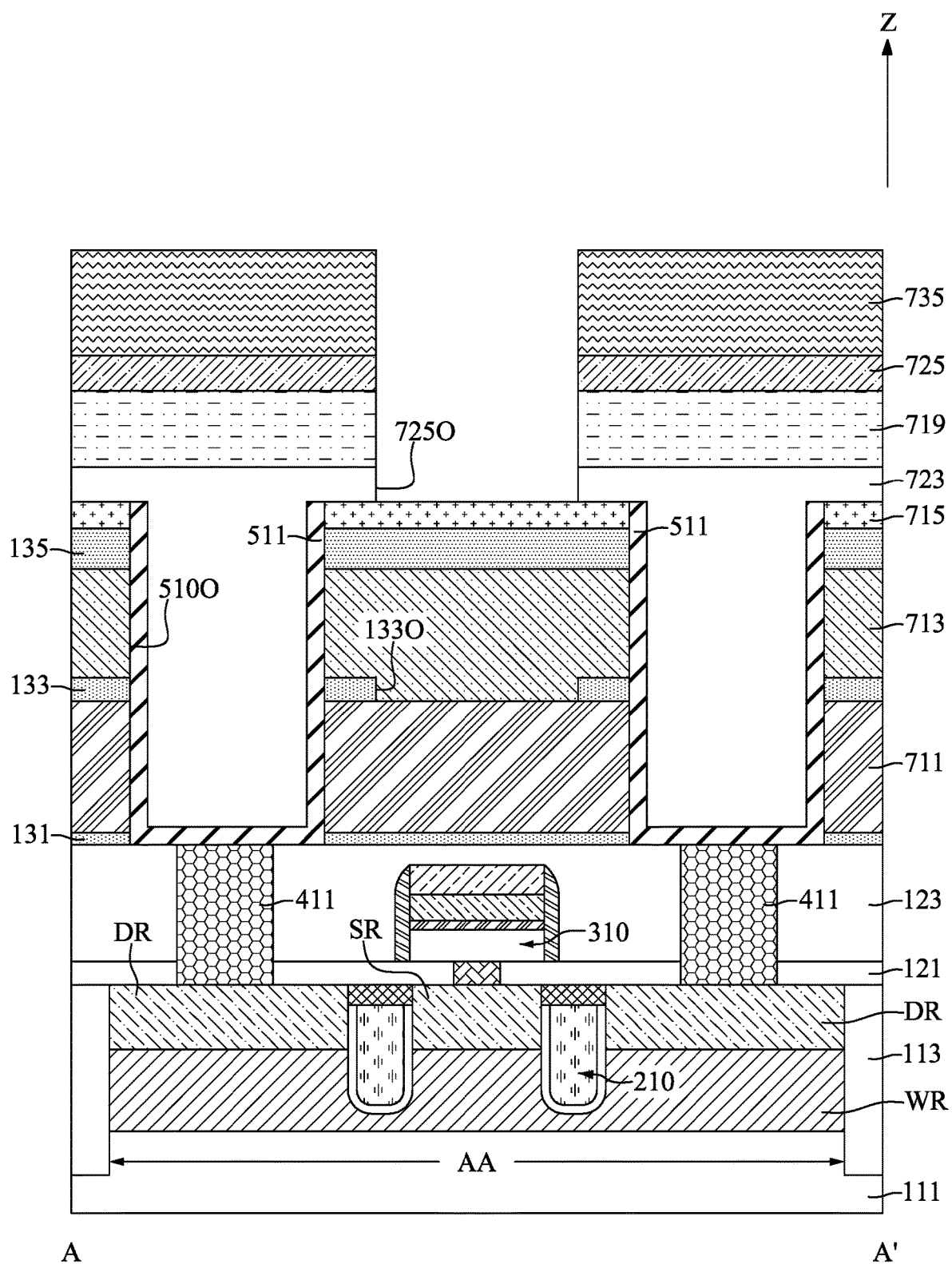
FIGS. 19 and 20 are schematic cross-sectional view diagrams taken along the line A-A' line in FIG. 18 illustrating part of the flow for fabricating the semiconductor device in accordance with one embodiment of the present disclosure.
Figure 20:
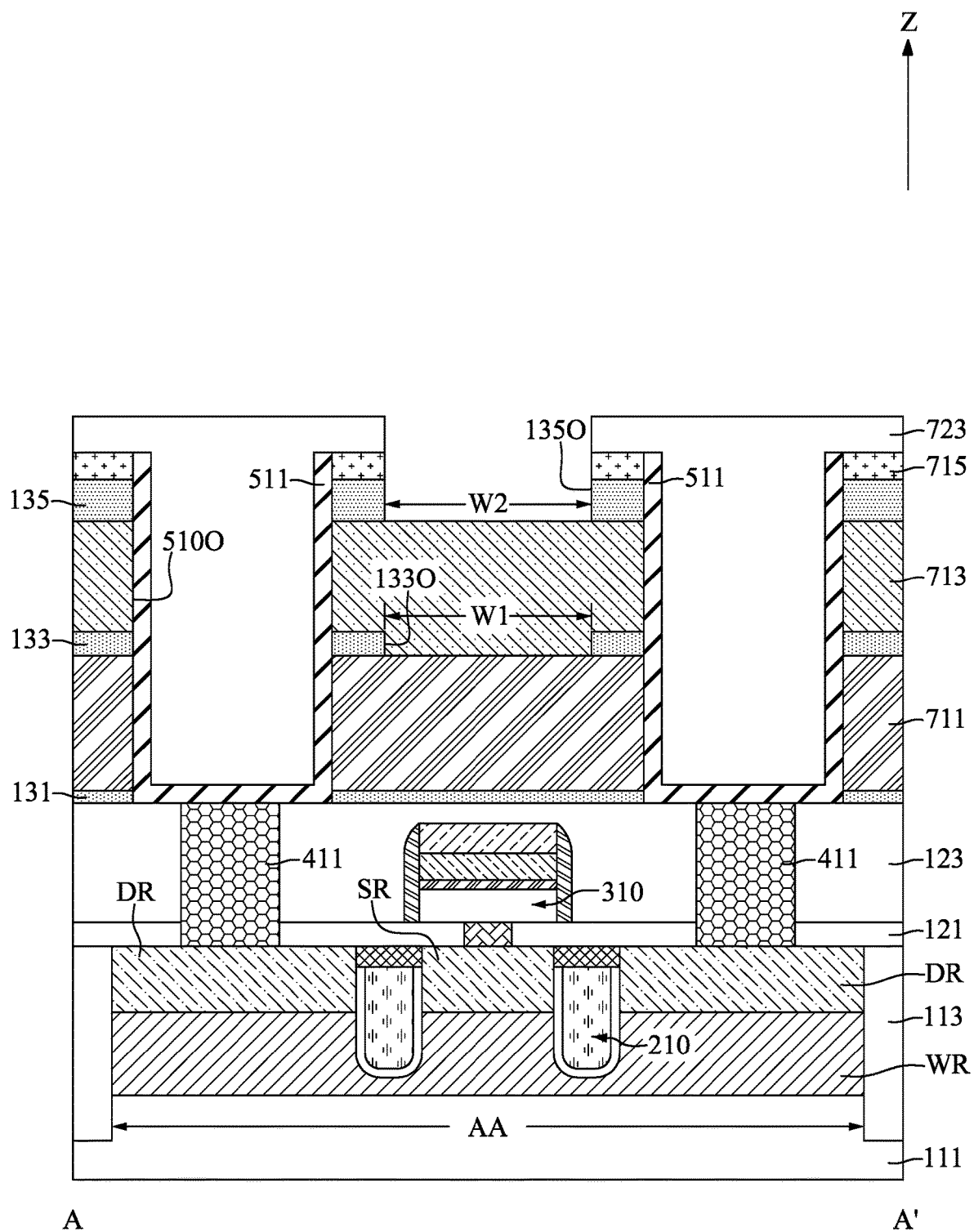

FIG. 18 illustrates, in a schematic top-view diagram, an intermediate semiconductor device in accordance with one embodiment of the present disclosure. FIGS. 19 and 20 are schematic cross-sectional view diagrams taken along the line A-A' line in FIG. 18 illustrating part of the flow for fabricating the semiconductor device 1A in accordance with one embodiment of the present disclosure.

With reference to FIGS. 18 and 19, the second hard mask layer 723 (or the third hard mask layer 725) may be patterned to form the plurality of openings 725O by performing an etching process using the patterned third mask layer 735 as the mask. Portions of the buffer layer 715 may be exposed through the plurality of openings 725O. After the second hard mask layer 723 is patterned, the third mask layer 735, the third hard mask layer 725, and the underfill layer 719 may be removed.

By using the same photomask for the patterning of the third mask layer 735 and the first mask layer 731, the plurality of openings 725O may be topographically aligned with the plurality of first openings 133O. The shape of the plurality of openings 725O and the shape of the plurality of first openings 133O may be the same in a top-view perspective.

With reference to FIG. 20, a second etching process may be performed using the patterned second hard mask layer 723 as the mask to form the plurality of second openings 135O along the buffer layer 715 and the higher supporting layer 135. The shape (or profile) and position of the plurality of second openings 135O may be determined by the plurality of openings 725O. That is, the plurality of second openings 135O may be topographically aligned with the plurality of first openings 133O. The shape of the plurality of second openings 135O and the shape of the plurality of first openings 133O may be the same in a top-view perspective. For brevity, clarity, and convenience of description, only one second opening 135O is described.

Detailedly, the width W1 of the first opening 133O and the width W2 of the second opening 135O may be substantially the same. The second opening 135O may be disposed between the adjacent pair of the lower electrodes 511. The second opening 135O may be topographically aligned with the common source region SR and/or the bit line structure 310. The second opening 135O may be overlapped or partially overlapped with the common source region SR in a top-view perspective. The second opening 135O may be partially overlapped with the bit line structure 310 in a top-view perspective. In some embodiments, the second opening 135O may be partially overlapped with the word line structure 210.

Alternatively, the second opening 135O may not be topographically aligned with the active area AA, the common source region SR, the bit line structure 310, and the word line structure 210. In other words, the second opening 135O may not be overlapped with the active area AA, the common source region SR, the bit line structure 310, and the word line structure 210 in a top-view perspective (not shown).

Figure 21:
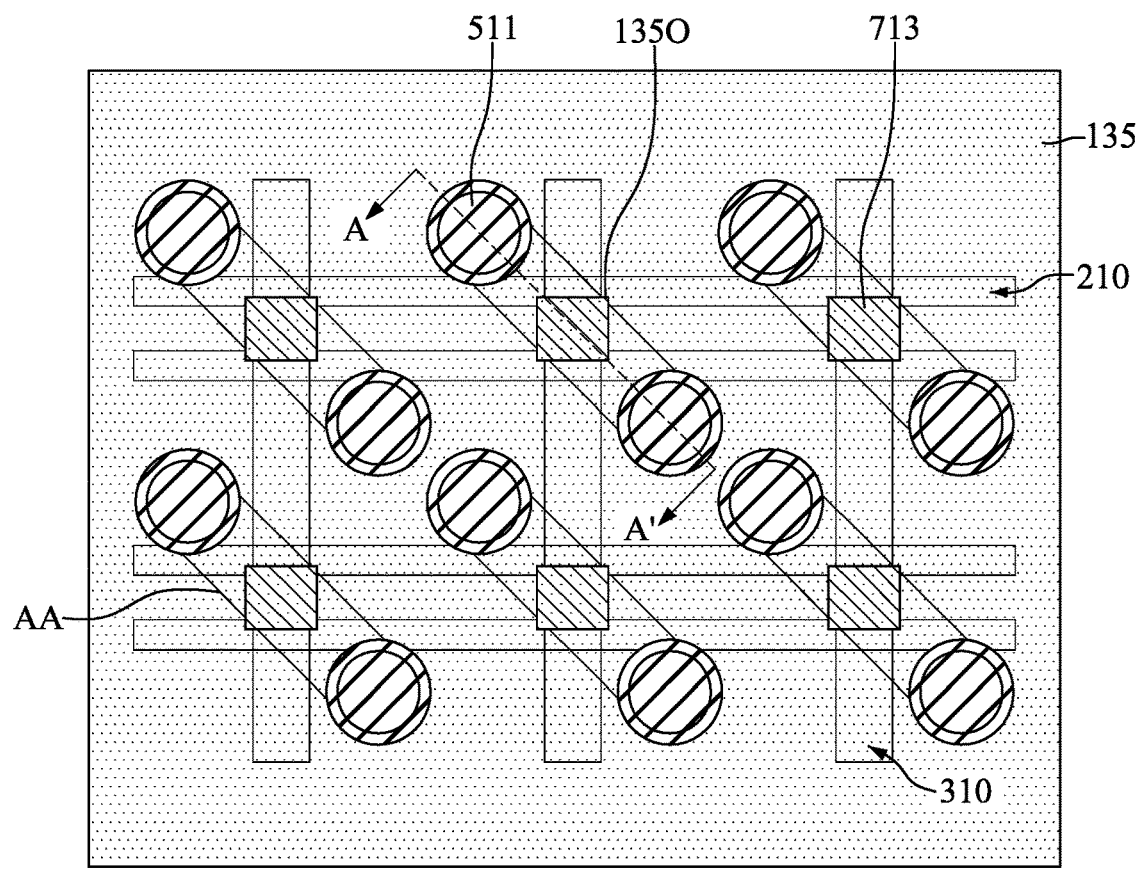
FIG. 21 illustrates, in a schematic top-view diagram, an intermediate semiconductor device in accordance with one embodiment of the present disclosure.

FIG. 21 illustrates, in a schematic top-view diagram, an intermediate semiconductor device in accordance with one embodiment of the present disclosure. FIGS. 22 to 26 are schematic cross-sectional view diagrams taken along the line A-A' line in FIG. 21 illustrating part of the flow for fabricating the semiconductor device 1A in accordance with one embodiment of the present disclosure.

Figure 22:
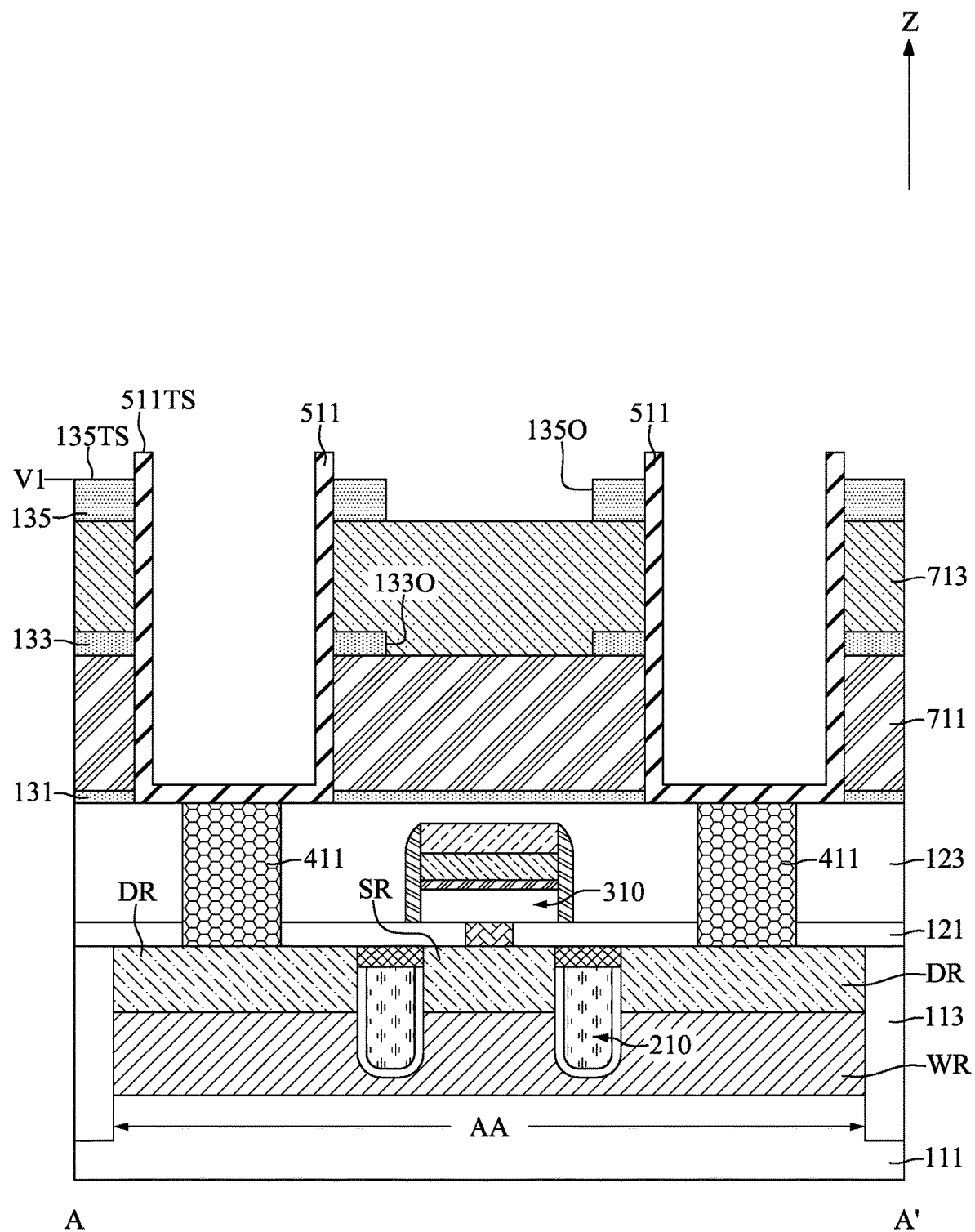
FIGS. 22 to 26 are schematic cross-sectional view diagrams taken along the line A-A' line in FIG. 21 illustrating part of the flow for fabricating the semiconductor device in accordance with one embodiment of the present disclosure.

With reference to FIGS. 21 and 22, the second hard mask layer 723 and the buffer layer 715 may be removed. After the removal of the second hard mask layer 723 and the buffer layer 715, the top surface 135TS of the higher supporting layer 135 may be exposed and may be located at a vertical V1 lower than the top surface 511Ts of the lower electrode 511.

With reference to FIG. 1 and FIGS. 23 to 26, at step S19, the top sacrificial layer 713 and the bottom sacrificial layer 711 may be removed, a capacitor dielectric layer 513 may be conformally formed on the plurality of lower electrodes 511, and an upper electrode 515 may be formed on the capacitor dielectric layer 513, wherein the plurality of lower electrodes 511, the capacitor dielectric layer 513, and the upper electrode 515 configure a plurality of capacitor structures 510.

Figure 23:
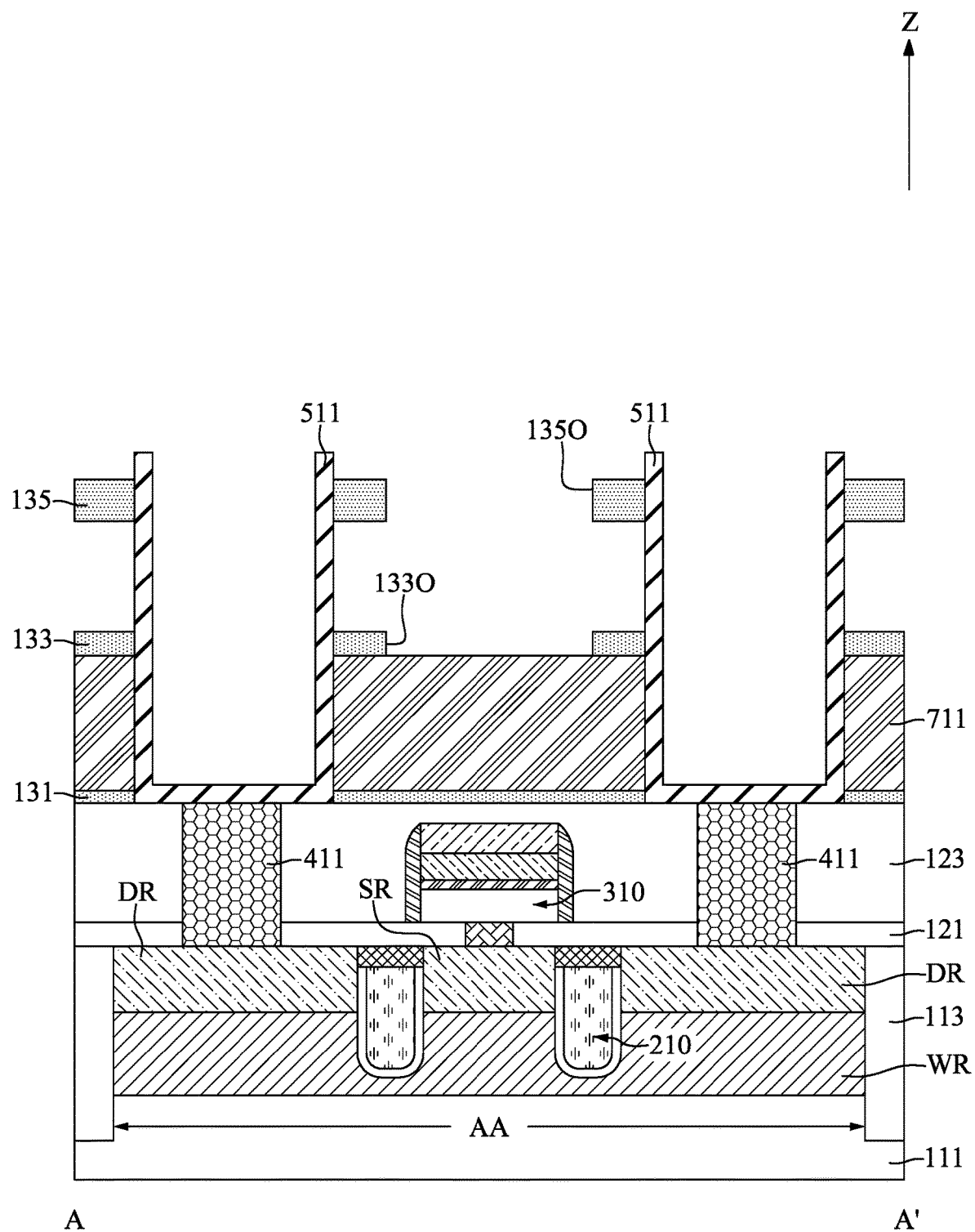

With reference to FIG. 23, the top sacrificial layer 713 may be removed. In some embodiments, a first wet etching process may be performed by applied etchant through the plurality of second openings 135O to remove the top sacrificial layer 713. In some embodiments, the etch rate ratio of the top sacrificial layer 713 to the higher supporting layer 135 may be between about 100:1 and about 1.05:1, between about 15:1 and about 2:1, or between about 10:1 and about 2:1 during the first wet etching process. In some embodiments, the etch rate ratio of the top sacrificial layer 713 to the lower supporting layer 133 may be between about 100:1 and about 1.05:1, between about 15:1 and about 2:1, or between about 10:1 and about 2:1 during the first wet etching process.

In some embodiments, when the bottom sacrificial layer 711 is formed of the material having etching selectivity to the top sacrificial layer 713, the etch rate ratio of the top sacrificial layer 713 to the bottom sacrificial layer 711 may be between about 100:1 and about 1.05:1, between about 15:1 and about 2:1, or between about 10:1 and about 2:1 during the first wet etching process. Alternatively, when the bottom sacrificial layer 711 and the top sacrificial layer 713 are formed of the same material, a portion of the bottom sacrificial layer 711 exposed through the plurality of first openings 133O may be also removed during the first wet etching process.

Figure 24:
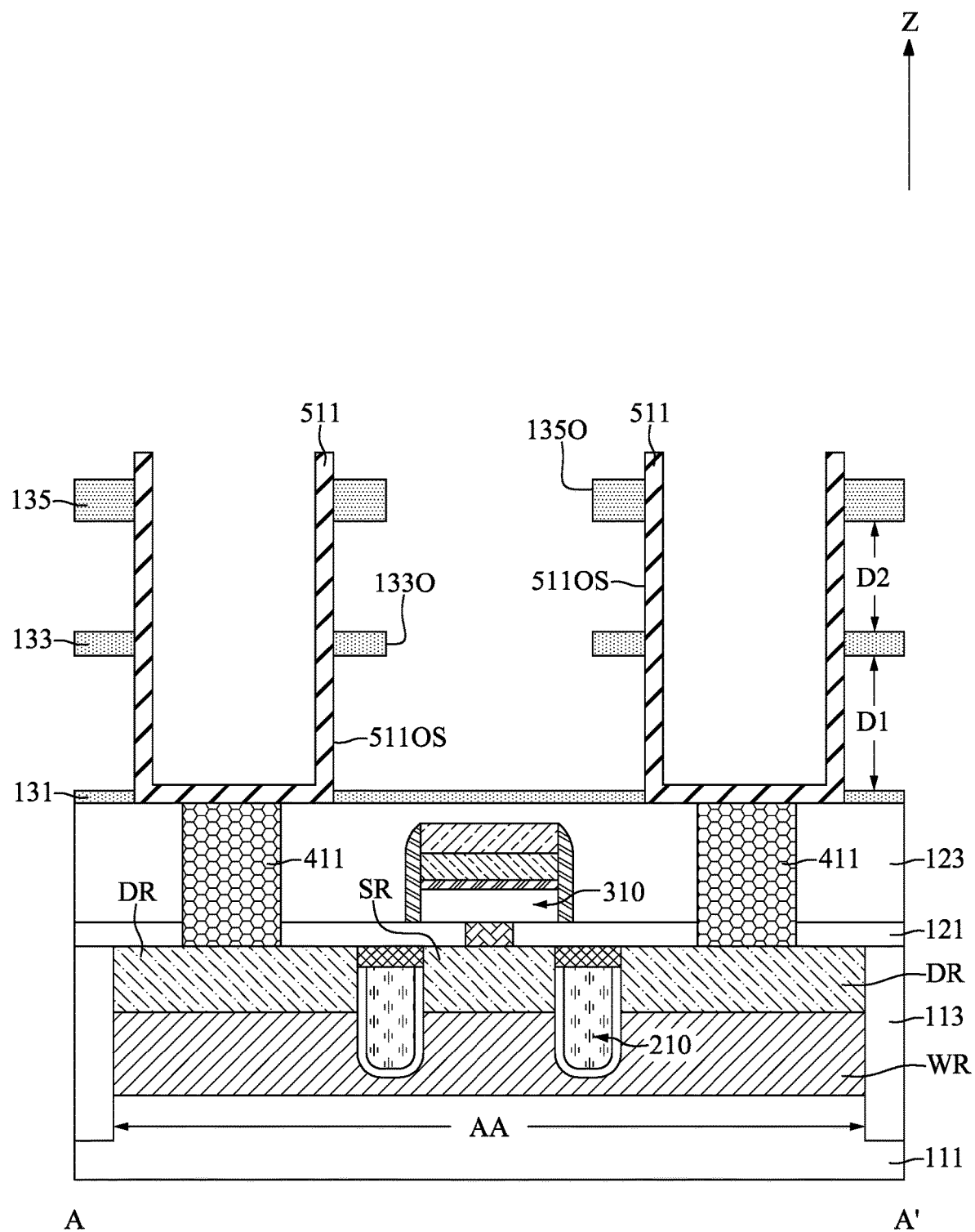

With reference to FIG. 24, the bottom sacrificial layer 711 may be removed. In some embodiments, a second wet etching process may be performed by applied etchant through the plurality of first openings 133O to remove the bottom sacrificial layer 711. In some embodiments, the etch rate ratio of the bottom sacrificial layer 711 to the higher supporting layer 135 may be between about 100:1 and about 1.05:1, between about 15:1 and about 2:1, or between about 10:1 and about 2:1 during the second wet etching process. In some embodiments, the etch rate ratio of the bottom sacrificial layer 711 to the lower supporting layer 133 may be between about 100:1 and about 1.05:1, between about 15:1 and about 2:1, or between about 10:1 and about 2:1 during the second wet etching process. In some embodiments, the etch rate ratio of the bottom sacrificial layer 711 to the etching stop layer 131 may be between about 100:1 and about 1.05:1, between about 15:1 and about 2:1, or between about 10:1 and about 2:1 during the second wet etching process.

In some embodiments, when the bottom sacrificial layer 711 and the top sacrificial layer 713 are formed of the same material, the bottom sacrificial layer 711 may be also completely removed during the first wet etching process.

In some embodiments, the distance D1 between the etching stop layer 131 and the lower supporting layer 133 and the distance D2 between the lower supporting layer 133 and the higher supporting layer 135 may be different. For example, the distance D1 between the etching stop layer 131 and the lower supporting layer 133 may be greater than the distance D2 between the lower supporting layer 133 and the higher supporting layer 135. Alternatively, in some embodiments, the distance D1 between the etching stop layer 131 and the lower supporting layer 133 and the distance D2 between the lower supporting layer 133 and the higher supporting layer 135 may be substantially the same.

Figure 25:
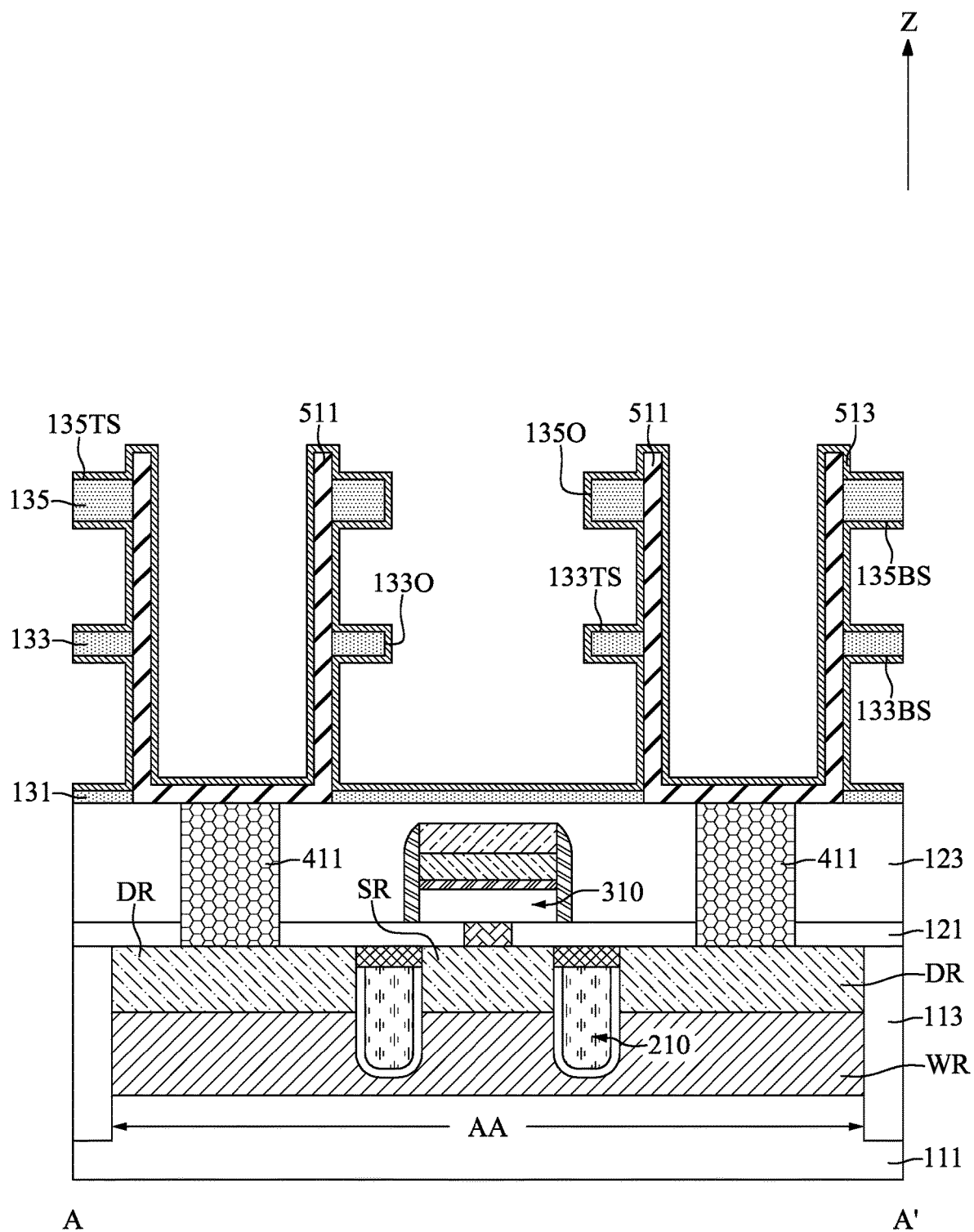

With reference to FIG. 25, the capacitor dielectric layer 513 may be conformally formed on the plurality of lower electrodes 511, on the etching stop layer 131, on the top surface 133TS and the bottom surface 133BS of the lower supporting layer 133, on the plurality of first openings 133O, on the top surface 135TS and the bottom surface 135BS of the higher supporting layer 135, and on the plurality of second openings 135O. In some embodiments, the capacitor dielectric layer 513 may include, for example, a high-k material, an oxide, a nitride, an oxynitride or a combination thereof. The high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. In some embodiments, the insulating layer may be formed by a deposition process including, for example, atomic layer deposition, chemical vapor deposition, plasma enhanced chemical vapor deposition, or other applicable deposition process.

Figure 26:
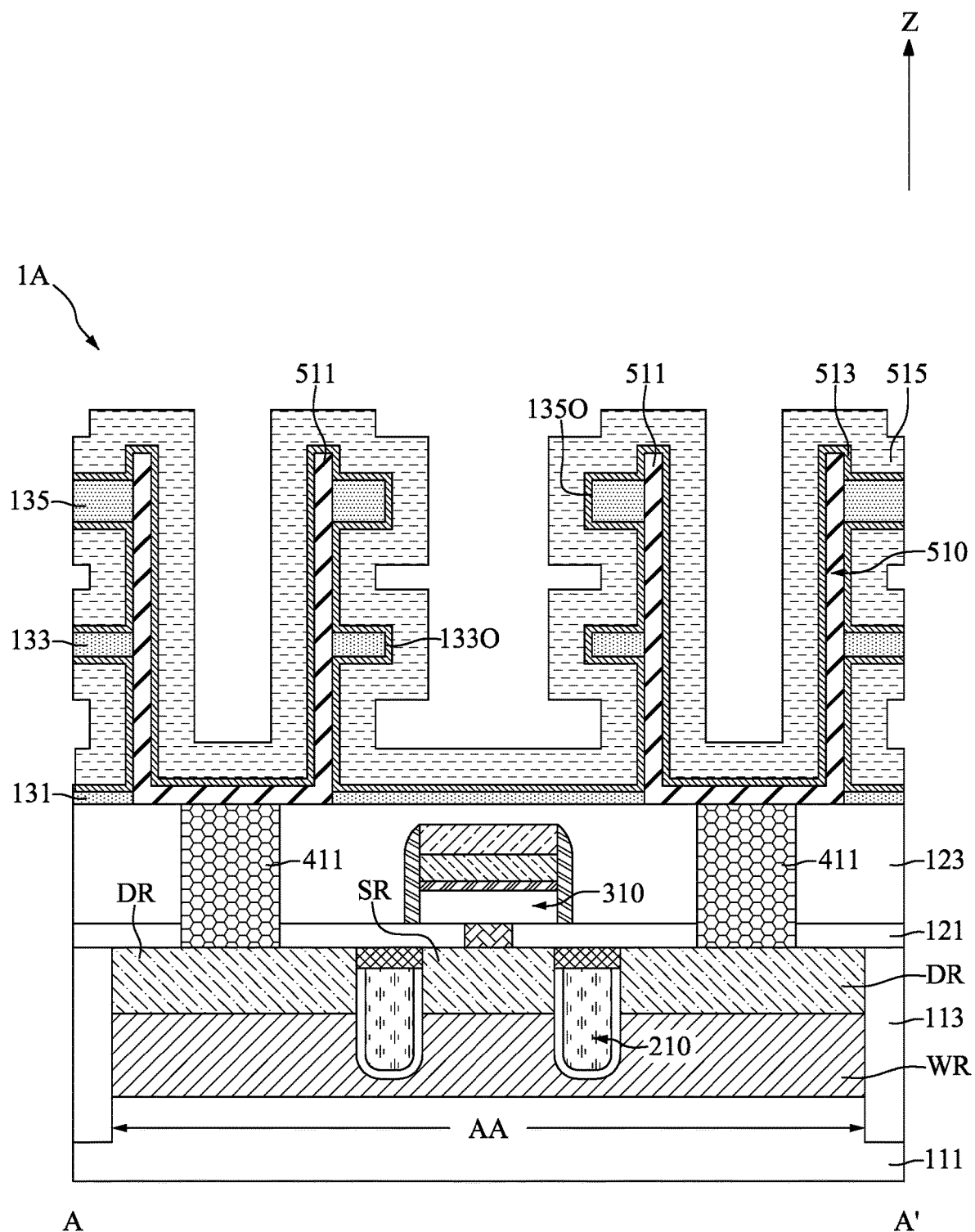

With reference to FIG. 26, the upper electrode 515 may be formed on the capacitor dielectric layer 513. In some embodiments, the upper electrode 515 may not completely fill the spaces between the plurality of lower electrodes 511, the spaces within each of the plurality of lower electrodes 511, the spaces between the plurality of first openings 133O, and the spaces between the plurality of second openings 135O. In some embodiments, the upper electrode 515 may completely fill the spaces between the plurality of lower electrodes 511, the spaces within each of the plurality of lower electrodes 511, the spaces between the plurality of first openings 133O, and the spaces between the plurality of second openings 135O.

In some embodiments, the upper electrode 515 may be formed of the same material as the plurality of lower electrodes 511. In some embodiments, the upper electrode 515 may be formed of, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the upper electrode 515 may include silicon and/or germanium with substantially no oxygen and nitrogen. As used in this regard, a feature with "substantially no oxygen and nitrogen" has less than 2%, less than 1% or less than 0.5% oxygen and nitrogen on an atomic basis. In some embodiments, the upper electrode 515 consists essentially of silicon, germanium, or silicon germanium.

In some embodiments, the upper electrode 515 may be formed by, for example, chemical vapor deposition, physical vapor deposition, sputtering, the like, or other applicable deposition process.

With reference to FIG. 26, the plurality of lower electrodes 511, the capacitor dielectric layer 513, and the upper electrode 515 together configure the plurality of capacitor structures 510.

FIGS. 27 to 33 are schematic cross-sectional view diagrams illustrating part of a flow for fabricating a semiconductor device 1B in accordance with another embodiment of the present disclosure.

Figure 27:
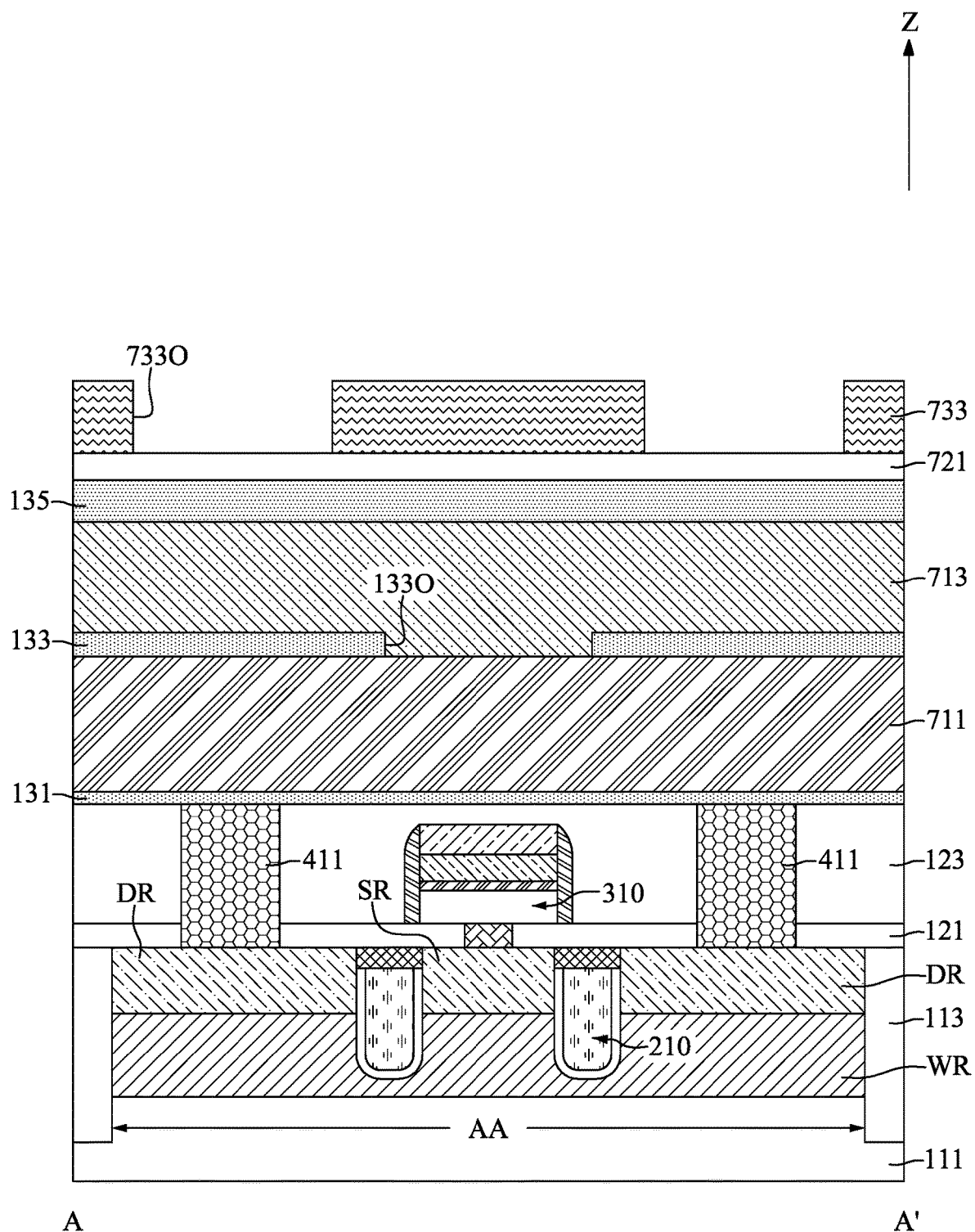
FIGS. 27 to 33 are schematic cross-sectional view diagrams illustrating part of a flow for fabricating a semiconductor device 1B in accordance with another embodiment of the present disclosure.

With reference to FIG. 27, an intermediate semiconductor device may be fabricated with a procedure similar to that illustrated in FIGS. 2 to 14, and descriptions thereof are not repeated herein. The first hard mask layer 721 may be directly formed on the higher supporting layer 135.

Figure 28:
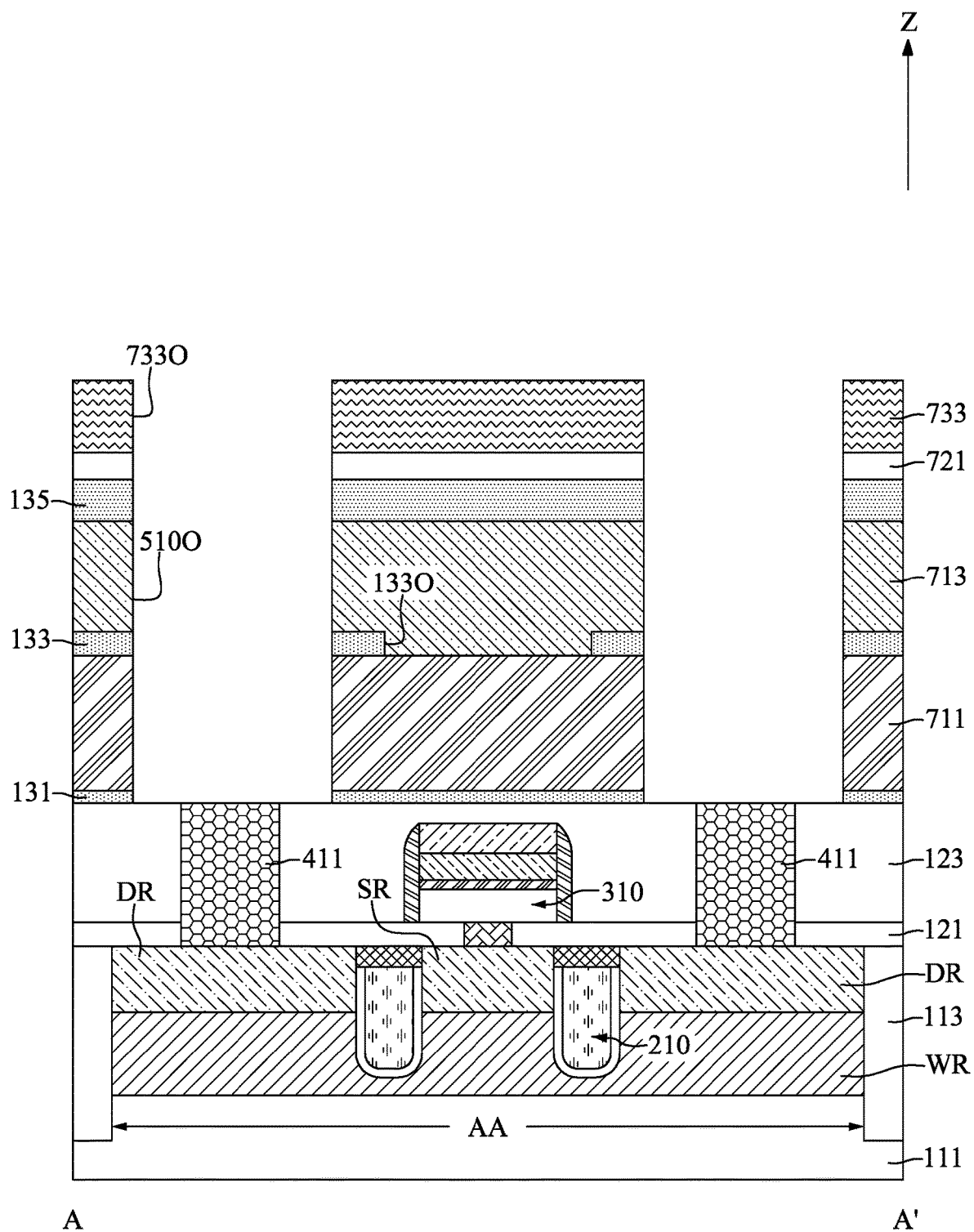

With reference to FIG. 28, the plurality of capacitor openings 510O may be formed with a procedure similar to that illustrated in FIG. 15, and descriptions thereof are not repeated herein.

Figure 29:
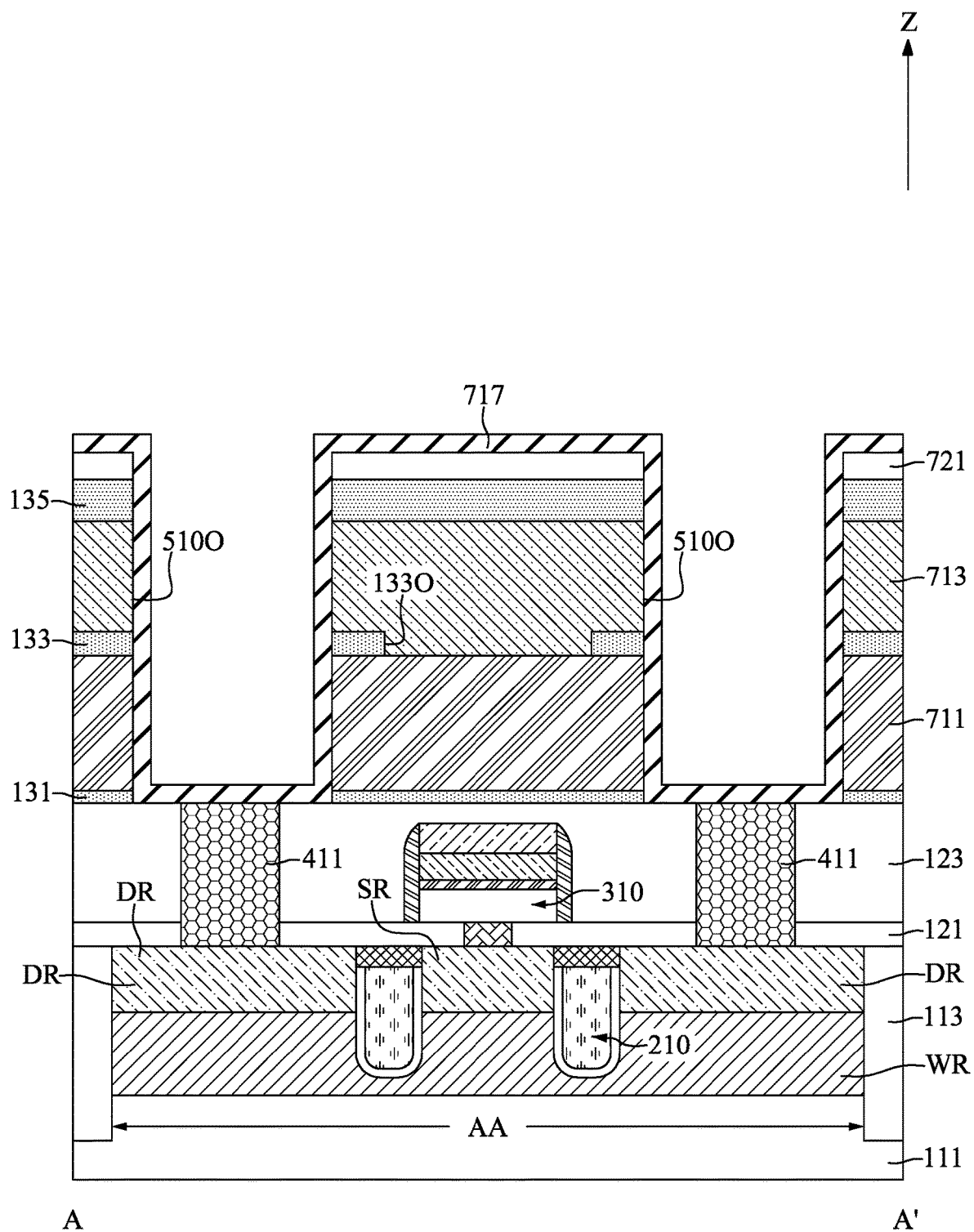

With reference to FIG. 29, the layer of first conductive material 717 may be formed with a procedure similar to that illustrated in FIG. 16, and descriptions thereof are not repeated herein.

Figure 30:
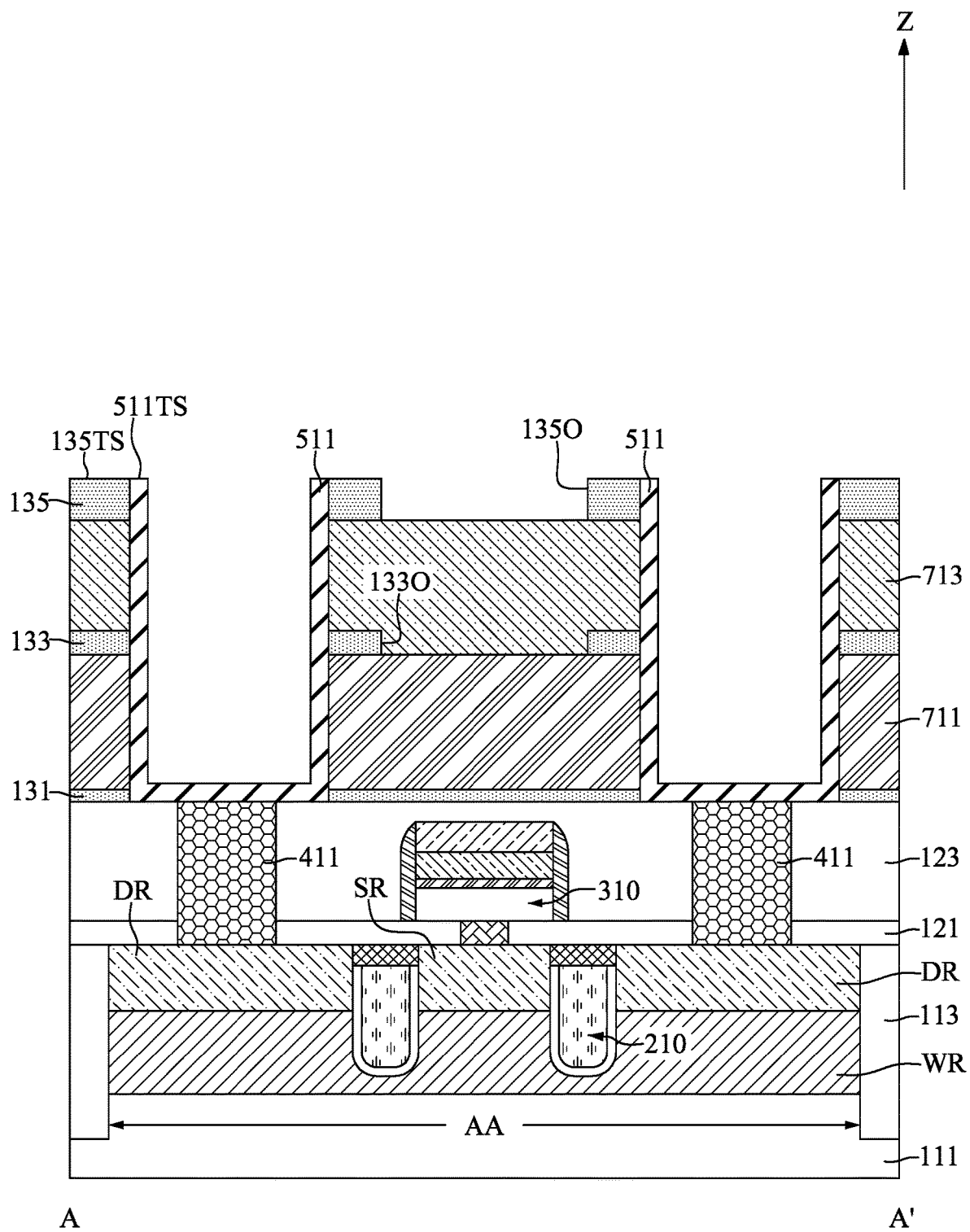

With reference to FIG. 30, the plurality of second openings 135O may be formed with a procedure similar to that illustrated in FIGS. 18 to 21, and descriptions thereof are not repeated herein. It should be noted that, in the present embodiment, the top surface 135TS of the higher supporting layer 135 and the top surfaces 511TS of the plurality of lower electrodes 511 may be substantially coplanar.

Figure 31:
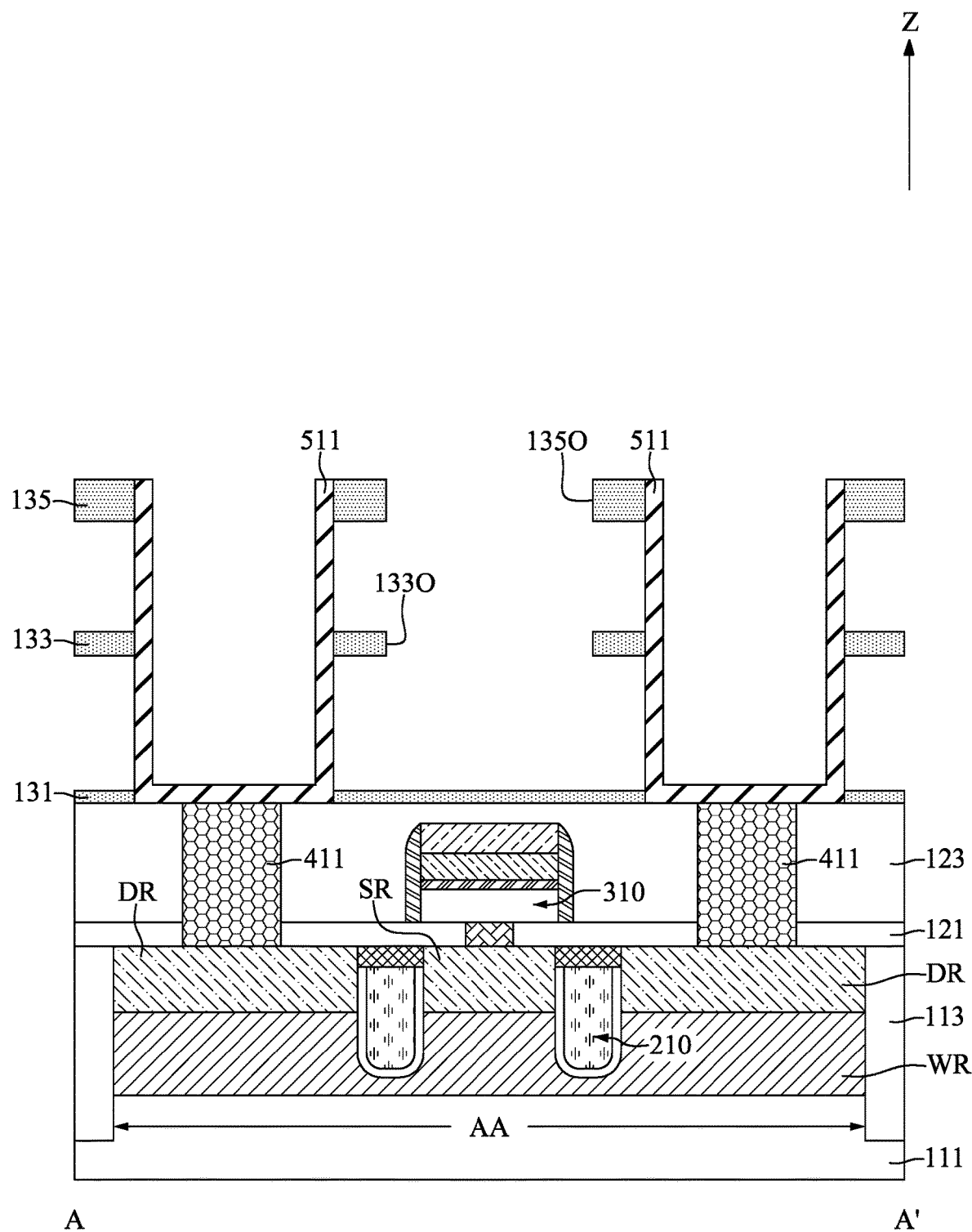

With reference to FIG. 31, the bottom sacrificial layer 711 and the top sacrificial layer 713 may be removed with a procedure similar to that illustrated in FIGS. 23 and 24, and descriptions thereof are not repeated herein.

Figure 32:
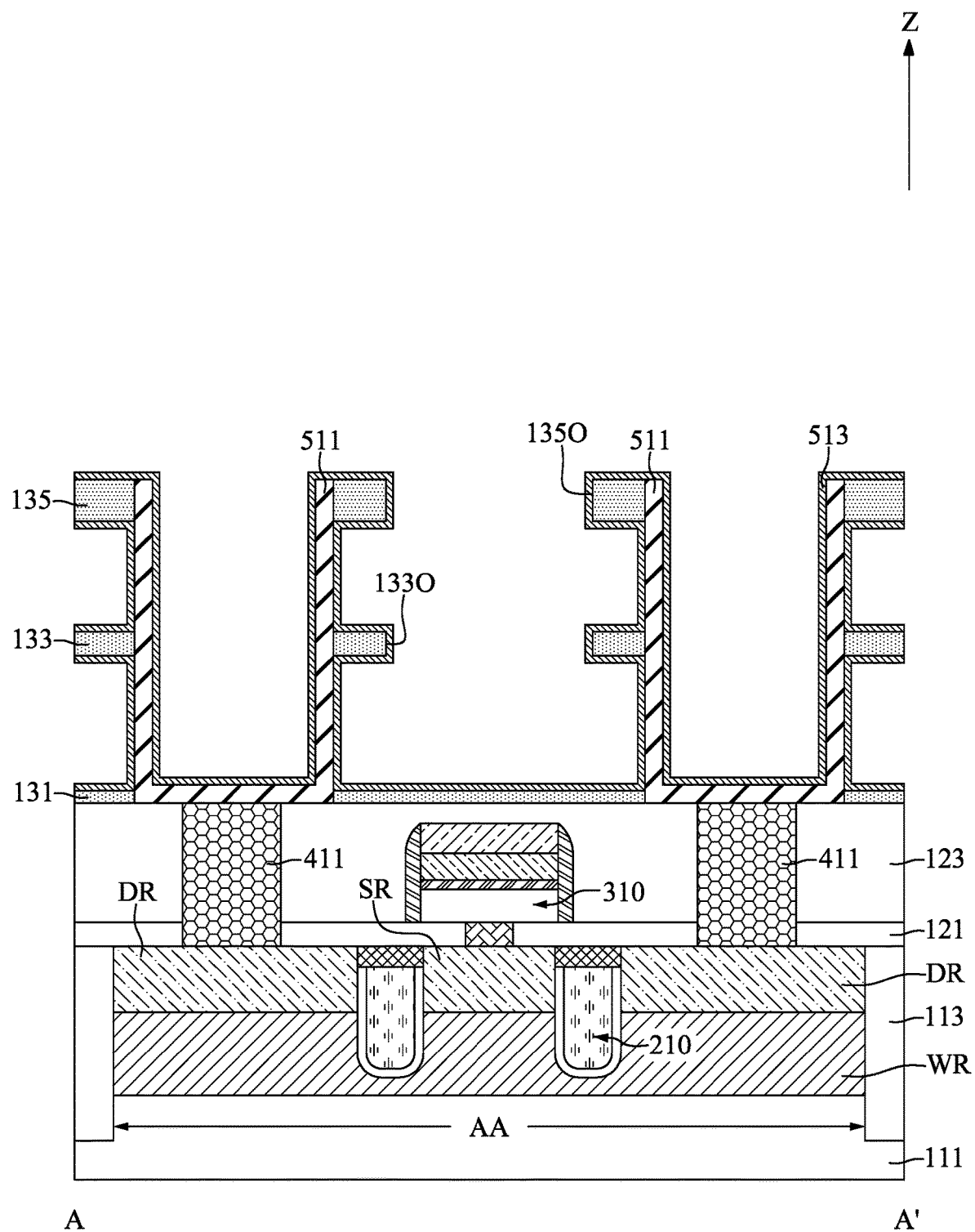

With reference to FIG. 32, the capacitor dielectric layer 513 may be formed with a procedure similar to that illustrated in FIG. 25, and descriptions thereof are not repeated herein.

Figure 33:
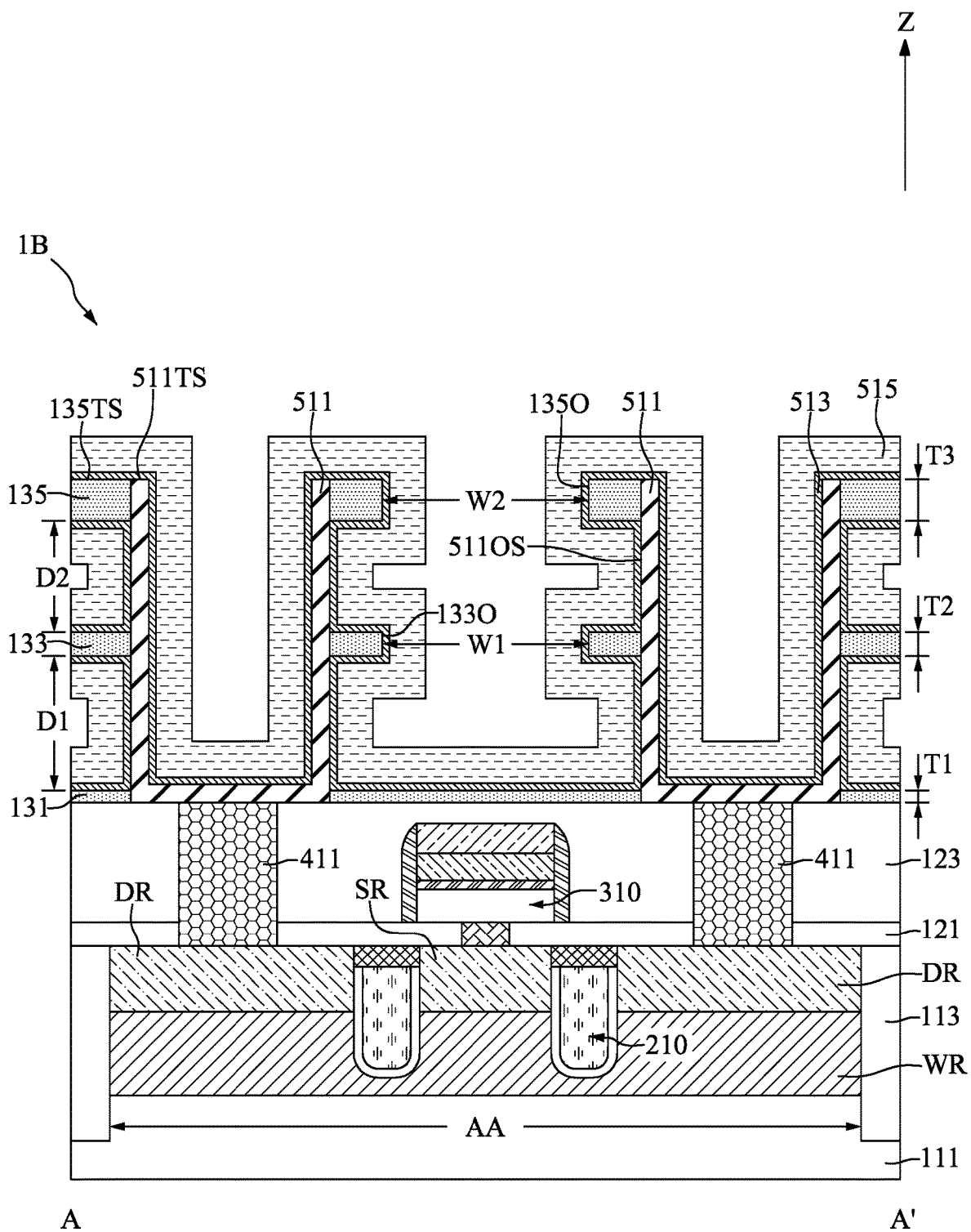

With reference to FIG. 33, the upper electrode 515 may be formed with a procedure similar to that illustrated in FIG. 26, and descriptions thereof are not repeated herein.

One aspect of the present disclosure provides a semiconductor device including a plurality of drain regions positioned in a substrate; a plurality of capacitor plugs positioned on the plurality of drain regions; a plurality of lower electrodes positioned on the plurality of capacitor plugs and respectively including a U-shaped cross-sectional profile; a lower supporting layer positioned above the substrate, positioned against on outer surfaces of the plurality of lower electrodes, and including: a plurality of first openings positioned along the lower supporting layer and between the plurality of lower electrodes; and a higher supporting layer positioned above the lower supporting layer, positioned against on the outer surfaces of the plurality of lower electrodes, and including: a plurality of second openings positioned along the higher supporting layer and topographically aligned with the plurality of first openings. The widths of the plurality of first openings and the widths of the plurality of second openings are substantially the same.

Another aspect of the present disclosure provides a semiconductor device including a plurality of drain regions positioned in a substrate; a plurality of capacitor plugs positioned on the plurality of drain regions; a plurality of lower electrodes positioned on the plurality of capacitor plugs and respectively including a U-shaped cross-sectional profile; a lower supporting layer positioned above the substrate, positioned against on outer surfaces of the plurality of lower electrodes, and including: a plurality of first openings positioned along the lower supporting layer and between the plurality of lower electrodes; and a higher supporting layer positioned above the lower supporting layer, positioned against on the outer surfaces of the plurality of lower electrodes, and including: a plurality of second openings positioned along the higher supporting layer and topographically aligned with the plurality of first openings. The widths of the plurality of first openings and the widths of the plurality of second openings are substantially the same. Top surfaces of the plurality of lower electrodes and a top surface of the higher supporting layer are substantially coplanar.

Another aspect of the present disclosure provides a method for fabricating a semiconductor device including providing a substrate, forming plurality of drain regions in the substrate, and forming a plurality of capacitor plugs on the plurality of drain regions; forming a bottom sacrificial layer on the plurality of capacitor plugs, forming a lower supporting layer on the bottom sacrificial layer, and forming a plurality of first openings along the lower supporting layer to expose the bottom sacrificial layer; forming a top sacrificial layer on the lower supporting layer and forming a higher supporting layer on the top sacrificial layer, forming a plurality of capacitor openings to expose the plurality of capacitor plugs, conformally forming a plurality of lower electrodes in the plurality of capacitor openings, and forming a plurality of second openings along the higher supporting layer and topographically aligned with the plurality of first openings; removing the top sacrificial layer and the bottom sacrificial layer to expose outer surfaces of the plurality of lower electrodes and conformally forming a capacitor dielectric layer on the plurality of lower electrodes, the lower supporting layer, and the higher supporting layer, and conformally forming an upper electrode on the capacitor dielectric layer. The widths of the plurality of first openings and the widths of the plurality of second openings are substantially the same.

Due to the design of the semiconductor device of the present disclosure, the plurality of first openings 133O and the plurality of second openings 135O may be formed using the same photomask. As a result, the cost of fabricating the semiconductor devices 1A, 1B may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a plurality of drain regions positioned in a substrate;
a plurality of capacitor plugs positioned on the plurality of drain regions;
a plurality of lower electrodes positioned on the plurality of capacitor plugs and respectively comprising a U-shaped cross-sectional profile;
a lower supporting layer positioned above the substrate, positioned against en outer surfaces of the plurality of lower electrodes, and comprising:
a plurality of first openings positioned along the lower supporting layer and between the plurality of lower electrodes; and
a higher supporting layer positioned above the lower supporting layer, positioned against the outer surfaces of the plurality of lower electrodes, and comprising:
a plurality of second openings positioned along the higher supporting layer and topographically aligned with the plurality of first openings;
a capacitor dielectric layer conformally positioned on the plurality of lower electrodes, the lower supporting layer, and the higher supporting layer;
an upper electrode positioned on the capacitor dielectric layer, wherein the plurality of lower electrodes, the capacitor dielectric layer, and the upper electrode configure a plurality of capacitor structures;
wherein a top surface of the higher supporting layer is at a vertical level lower than top surfaces of the plurality of lower electrodes;
wherein the plurality of lower electrodes are circular shaped in a top-view perspective;
wherein widths of the plurality of first openings and widths of the plurality of second openings are the same;
wherein the lower supporting layer and the higher supporting layer comprise the same material;
wherein a thickness of the lower supporting layer and a thickness of the higher supporting layer are different.

2. The semiconductor device of claim 1, further comprising an etching stop layer positioned below the lower supporting layer and positioned against on the outer surfaces of the plurality of lower electrodes.

3. The semiconductor device of claim 2, wherein the etching stop layer and the lower supporting layer comprise the same material.

4. The semiconductor device of claim 2, wherein the etching stop layer and the lower supporting layer comprise different materials.

5. The semiconductor device of claim 2, wherein a distance between the etching stop layer and the lower supporting layer is different from a distance between the higher supporting layer and the lower supporting layer.

6. The semiconductor device of claim 2, wherein a distance between the etching stop layer and the lower supporting layer is the same as a distance between the higher supporting layer and the lower supporting layer.

7. The semiconductor device of claim 1, further comprising a plurality of word line structures positioned in the substrate, a plurality of bit line structures positioned between the etching stop layer and the substrate, wherein the plurality of lower electrodes are circular shaped in a top-view perspective.

8. A semiconductor device, comprising:
a plurality of drain regions positioned in a substrate;
a plurality of capacitor plugs positioned on the plurality of drain regions;
a plurality of lower electrodes positioned on the plurality of capacitor plugs and respectively comprising a U-shaped cross-sectional profile;
a lower supporting layer positioned above the substrate, positioned against outer surfaces of the plurality of lower electrodes, and comprising:
a plurality of first openings positioned along the lower supporting layer and between the plurality of lower electrodes; and a higher supporting layer positioned above the lower supporting layer, positioned against the outer surfaces of the plurality of lower electrodes, and comprising:
a plurality of second openings positioned along the higher supporting layer and topographically aligned with the plurality of first openings;
a capacitor dielectric layer conformally positioned on the plurality of lower electrodes, the lower supporting layer, and the higher supporting layer;
an upper electrode positioned on the capacitor dielectric layer, wherein the plurality of lower electrodes, the capacitor dielectric layer, and the upper electrode configure a plurality of capacitor structures;
wherein a top surface of the higher supporting layer is at a vertical level lower than top surfaces of the plurality of lower electrodes;
wherein the plurality of lower electrodes are circular shaped in a top-view perspective;
wherein widths of the plurality of first openings and widths of the plurality of second openings are the same;
wherein the lower supporting layer and the higher supporting layer comprise different materials;
wherein a thickness of the lower supporting layer and a thickness of the higher supporting layer are the same.

9. A semiconductor device, comprising:
a plurality of drain regions positioned in a substrate;
a plurality of capacitor plugs positioned on the plurality of drain regions;
a plurality of lower electrodes positioned on the plurality of capacitor plugs and respectively comprising a U-shaped cross-sectional profile;
a lower supporting layer positioned above the substrate, positioned against outer surfaces of the plurality of lower electrodes, and comprising:
a plurality of first openings positioned along the lower supporting layer and between the plurality of lower electrodes; and
a higher supporting layer positioned above the lower supporting layer, positioned against the outer surfaces of the plurality of lower electrodes, and comprising:
a plurality of second openings positioned along the higher supporting layer and topographically aligned with the plurality of first openings;
a plurality of word line structures positioned in the substrate;
a plurality of bit line structures positioned between the etching stop layer and the substrate;
a capacitor dielectric layer and;
an upper electrode;
wherein widths of the plurality of first openings and widths of the plurality of second openings are the same;
wherein top surfaces of the plurality of lower electrodes and a top surface of the higher supporting layer are coplanar;
wherein the capacitor dielectric layer is conformally positioned on the plurality of lower electrodes, the lower supporting layer, and the higher supporting layer;
wherein the upper electrode is positioned on the capacitor dielectric layer;
wherein the plurality of lower electrodes, the capacitor dielectric layer, and the upper electrode configure a plurality of capacitor structures;
wherein the lower supporting layer and the higher supporting layer comprise the same material, a thickness of the lower supporting layer and a thickness of the higher supporting layer are different.

10. The semiconductor device of claim 9, further comprising an etching stop layer positioned below the lower supporting layer and positioned against on the outer surfaces of the plurality of lower electrodes, wherein a distance between the etching stop layer and the lower supporting layer is different from a distance between the higher supporting layer and the lower supporting layer.

* * * * *